(12) United States Patent
Galazka et al.

(10) Patent No.: US 10,208,399 B2
(45) Date of Patent: Feb. 19, 2019

(54) METHOD AND APPARATUS FOR GROWING INDIUM OXIDE ($IN_2O_3$) SINGLE CRYSTALS AND INDIUM OXIDE ($IN_2O_3$) SINGLE CRYSTAL

(75) Inventors: Zbigniew Galazka, Berlin (DE); Roberto Fornari, Berlin (DE); Reinhard Uecker, Eggersdorf (DE)

(73) Assignee: FORSCHUNGSVERBUND BERLIN E.V., Berlin (DE)

( * ) Notice: Subject to any disclaimer, the term of this patent is extended or adjusted under 35 U.S.C. 154(b) by 726 days.

(21) Appl. No.: 14/394,858

(22) PCT Filed: Apr. 24, 2012

(86) PCT No.: PCT/EP2012/057447
§ 371 (c)(1),
(2), (4) Date: Oct. 16, 2014

(87) PCT Pub. No.: WO2013/159808
PCT Pub. Date: Oct. 31, 2013

(65) Prior Publication Data
US 2015/0125717 A1    May 7, 2015

(51) Int. Cl.
*C30B 11/00* (2006.01)
*C30B 30/04* (2006.01)
(Continued)

(52) U.S. Cl.
CPC .............. *C30B 30/04* (2013.01); *C30B 11/00* (2013.01); *C30B 11/002* (2013.01);
(Continued)

(58) Field of Classification Search
CPC .......... C30B 15/00; C30B 29/16; C30B 11/00
See application file for complete search history.

(56) References Cited

U.S. PATENT DOCUMENTS

| | | | | |
|---|---|---|---|---|
| 5,275,229 A | * | 1/1994 | Fishman | F27B 14/061 164/493 |
| 6,030,507 A | * | 2/2000 | Lupton | C01B 13/322 204/164 |
| 2011/0181950 A1 | * | 7/2011 | Makikawa | C03C 3/068 359/484.03 |

FOREIGN PATENT DOCUMENTS

| | | |
|---|---|---|
| DE | 102004003596 A1 | 8/2005 |
| EP | 1 939 319 A1 | 7/2008 |
| GB | 2 047 113 A | 11/1980 |

OTHER PUBLICATIONS

Teweldemedhin et al., "Growth and Physical Properties of Metallic $In_2O_3$ Single Crystals", Journal of Solid State Chemistry 86, 1990, pp. 109-115.
(Continued)

*Primary Examiner* — Matthew J Song
(74) *Attorney, Agent, or Firm* — Marshall, Gerstein & Borun LLP

(57) ABSTRACT

A method and apparatus for growing truly bulk $In_2O_3$ single crystals from the melt, as well as melt-grown bulk $In_2O_3$ single crystals are disclosed. The growth method comprises a controlled decomposition of initially non-conducting $In_2O_3$ starting material (23) during heating-up of a noble metal crucible (4) containing the $In_2O_3$ starting material (23) and thus increasing electrical conductivity of the $In_2O_3$ starting material with rising temperature, which is sufficient to couple with an electromagnetic field of an induction coil (6) through the crucible wall (24) around melting point of $In_2O_3$. Such coupling leads to an electromagnetic levitation of at least a portion (23.1) of the liquid $In_2O_3$ starting material with a neck (26) formation acting as crystallization seed. During cooling down of the noble metal crucible (4) with the liquid $In_2O_3$ starting material at least one bulk $In_2O_3$ single crystal (28.1, 28.2) is formed. We named this novel
(Continued)

crystal growth method the "Levitation-Assisted Self-Seeding Crystal Growth Method". The apparatus for growing bulk $In_2O_3$ single crystals from the melt comprises an inductively heated thermal system with a noble metal crucible (4) and evacuation passages (22, 22.1) for gaseous decomposition products of $In_2O_3$, while keeping very low temperature gradients. Various configurations of the induction coil (6), the noble metal crucible (4) and a lid (12) covering the crucible can be utilized to obtain very low temperature gradients, sufficient evacuation passages and a high levitation force. The electrical properties of the melt grown $In_2O_3$ single crystals can be modified in a wide range by at least one heat treatment in suitable atmospheres and appropriate temperatures.

33 Claims, 7 Drawing Sheets

(51) Int. Cl.
    *C30B 15/00*     (2006.01)
    *C30B 11/14*     (2006.01)
    *C30B 29/16*     (2006.01)
    *H01F 1/01*     (2006.01)
(52) U.S. Cl.
    CPC .......... *C30B 11/003* (2013.01); *C30B 11/007* (2013.01); *C30B 11/14* (2013.01); *C30B 15/00* (2013.01); *C30B 29/16* (2013.01); *H01F 1/01* (2013.01); *Y10T 117/1004* (2015.01)

(56) References Cited

OTHER PUBLICATIONS

Kanai, "Elecronic Conduction in Mg Doped $In_2O_3$ Single Crystals", Japanese Journal of Applied Physics, vol. 24, No. 5, May 1985, pp. L361-L363.
De Wit, "Preparation of $In_2O_3$ Single-Crystals Via Chemical Transport Reaction", Journal of Crystal Growth 12, 1972, pp. 183-184.
Search Report and Written Opinion in Application No. PCT/EP2012/057447 dated Nov. 9, 2012, 10 pages.
International Preliminary Report on Patentability in Application No. PCT/EP2012/057447 dated Nov. 6, 2014, 8 pages.

* cited by examiner

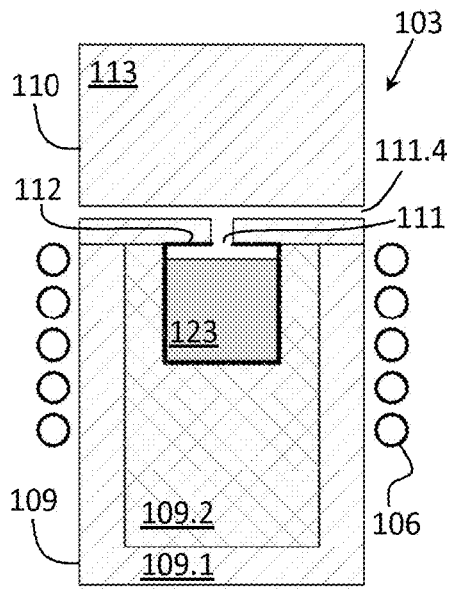
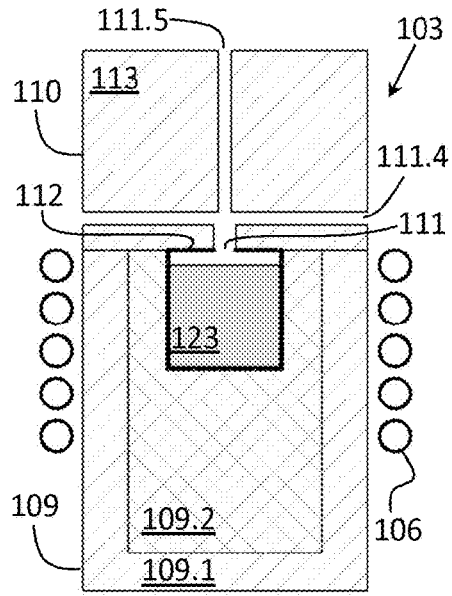
Fig. 4A
Fig. 4B
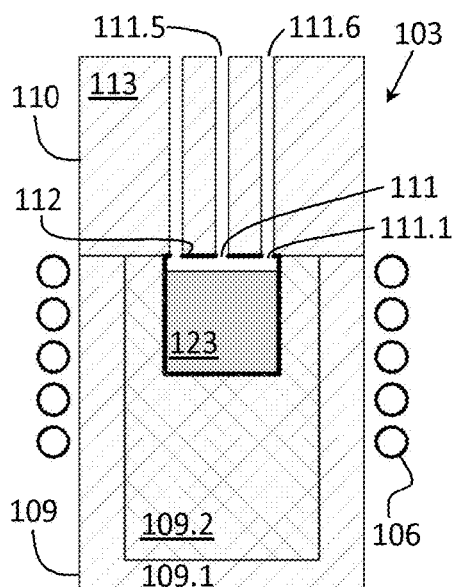
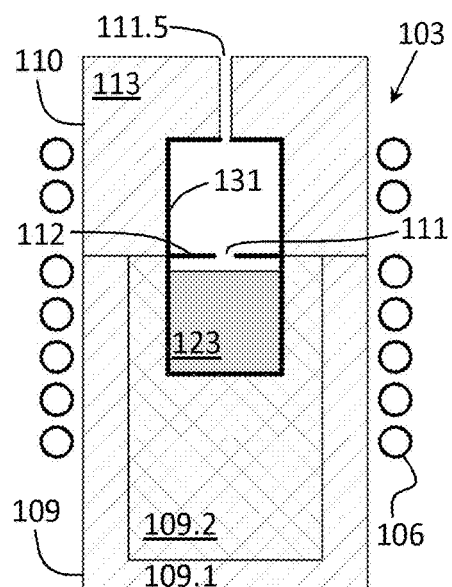
Fig. 4C
Fig. 4D

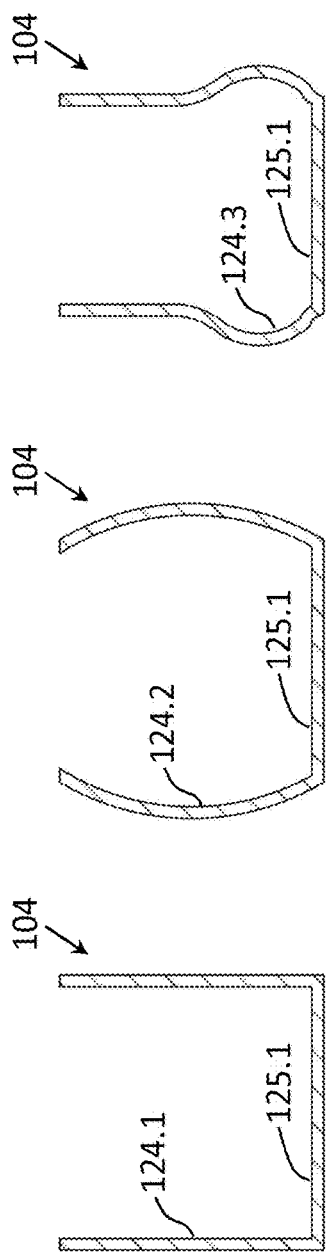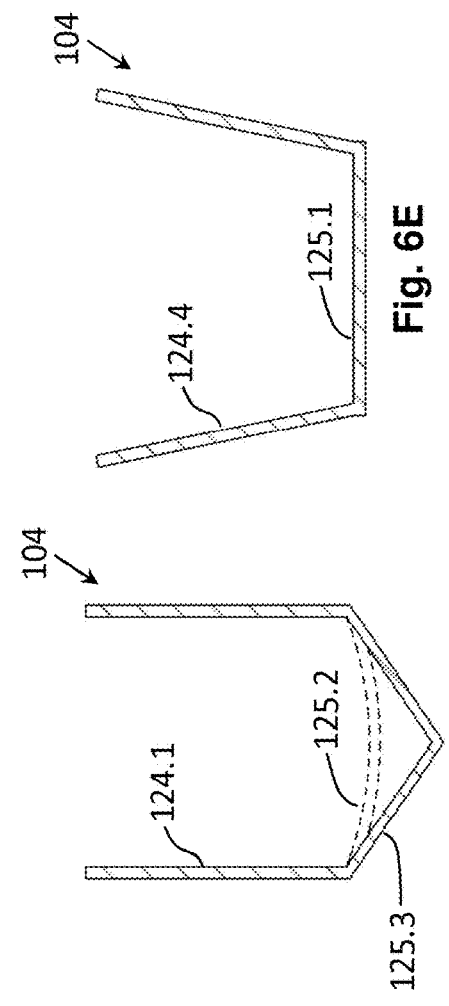

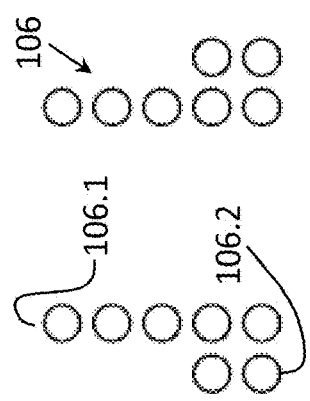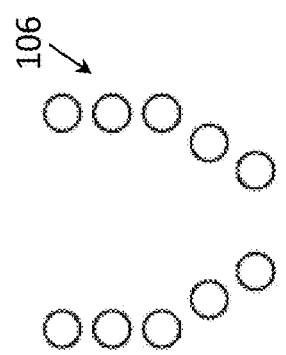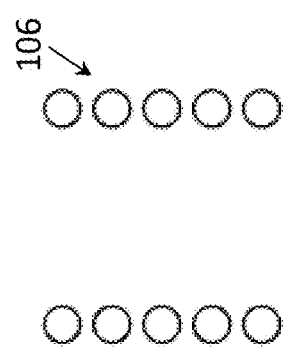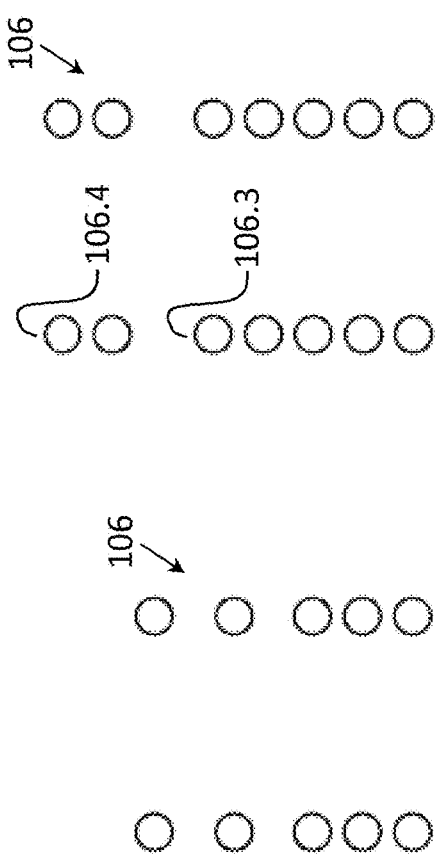

METHOD AND APPARATUS FOR GROWING INDIUM OXIDE (IN$_2$O$_3$) SINGLE CRYSTALS AND INDIUM OXIDE (IN$_2$O$_3$) SINGLE CRYSTAL

TECHNICAL FIELD

The present invention relates to a method and apparatus for growing indium oxide (In$_2$O$_3$) single crystals, to indium oxide (In$_2$O$_3$) single crystals obtained by said growth method, as well as to the use of said In$_2$O$_3$ single crystals.

BACKGROUND OF THE INVENTION

Oxide single crystals constitute crucial materials for many electronic and optoelectronic applications, such as lasers, non-linear optics, scintillators, piezoelectrics, transparent semiconductors or transparent conductors, superconductors and like. For many, if not majority of such applications bulk singles crystals are required, from which electronic or optoelectronic components can be prepared, or substrates for thin film depositions. Since oxides have a wide range of melting points, roughly ranging between about 800° C. and about 3000° C., different thermodynamic behavior as well as different thermal and physical properties, a number of growth techniques have been developed to obtain bulk single crystals. Such growth techniques can be divided into methods utilizing crystallization from: (i) the liquid phase (melt), (ii) the vapor phase, and (iii) the solution.

The group (i) includes the Czochralski method, the vertical and horizontal Bridgman method, the Kyropolous method, the Heat Exchanger Method (HEM), the Verneuil method, the Skull Melting (or Cold Crucible) method, the Optical Floating-Zone method (OFZ), the Edge-Defined Film Fed Growth method (EFG), the Micro-Pulling Down method, the Laser-Heated Pedestal Growth method (LHPG), and modifications of these techniques. Melt crystal growth techniques can be divided into methods using a metal crucible (Czochralski, Bridgman, Kyropolous, HEM, EFG, and Micro Pulling Down) and no metal crucible at all (Verneuil, Skull Melting, OFZ, LHPG). The principles of these methods are easily accessible in technical and scientific publications. The present invention refers to a novel method which may be classified under the group (i) using the metal crucible.

The group (ii) includes the Chemical Vapor Transport (CVT), Physical Vapor Transport (PVT) and their modifications. The group (iii) includes the Flux method, Hydrothermal method and Top-Seeded Solution Growth method (TSSG).

There are also a number of thin film or layer growth techniques and they require substrates, on which the films or layers can be deposited. Examples of such techniques include: Spray Pyrolysis and Hydrolysis, Sol-Gel, Sputtering, Electron Beam Evaporation, Pulsed Laser Deposition (PLD), Molecular Beam Epitaxy (MBE), Metal Organic Chemical Vapor Deposition (MOCVD), and like.

Oxides are typically electrical insulators, but there is a group of oxides, which exhibit semiconducting or conducting behavior once in the crystalline state. Since oxides have usually a wide optical band gap (>2 eV), they are also transparent to visible light, contrary to classical semiconductors. Such materials are known as Transparent Conducting or Semiconducting Oxides (TCOs or TSOs). Such TCOs or TCOs include gallium oxide (β-Ga$_2$O$_3$), zinc oxide (ZnO), tin oxide (SnO$_2$), indium oxide (In$_2$O$_3$) and several other materials, such as cadmium oxide (CdO), nickel oxide (NiO) and copper oxide (CuO). Since TCOs and TSOs exhibit both transparency, even down do deep ultraviolet region (DUV), and semiconducting or conducting behavior, they have been or can be used in a wide range of electronic and in particular optoelectronic applications, such as transparent electrodes for solar cells and flat panel displays, energy efficient windows, transparent thin film transistors such as MISFET and MESFET, Schottky diodes, light emitting diodes and gas sensors.

In$_2$O$_3$ doped with Sn (so called ITO) is an important industrial material, which is widely used in the form of amorphous layers as transparent electrodes for solar cells and flat panel displays. Pure (i.e. undoped) In$_2$O$_3$ can potentially be used in all other applications typical for TCOs or TSOs.

In$_2$O$_3$ in the form of very small single crystals has been known for over 50 years. The first single crystals of In$_2$O$_3$ were grown by the flux method (J. P. Remeika, E. G. Spencer; J. Appl. Phys. 35, 1964, p 2803) and later from the vapor phase (J. H. W. De Wit; J. Cryst. Growth 12, 1972, p. 183) and electrolysis (N. Imanaka et al.; J. Cryst. Growth 264, 2004, p. 134). In each case the crystals were of very small size (needle-shaped crystals or very small plates), insufficient for any practical application, and were also contaminated by the solvent or chemical agents.

Also layer growth techniques were applied to pure In$_2$O$_3$ and the resulting In$_2$O$_3$ films were either amorphous or crystalline.

Truly bulk In$_2$O$_3$ single crystals have not been available so far. Lack of bulk single crystals limits above-discussed applications of In$_2$O$_3$, and electrical properties thereof in large single crystals still remain unexplored. The reason, why bulk In$_2$O$_3$ single crystals could not be grown from the melt, lies in the chemical instability of that compound at elevated temperatures, that is, In$_2$O$_3$ starts to decompose just above 1000° C., far below its melting point which is about 1950° C. To stabilize In$_2$O$_3$ high oxygen partial pressure in the growth chamber is required (>1 bar), but this is in contradiction to the uppermost acceptable level (approximately 0.02 bar) for using iridium as a crucible material. For other high-melting refractory crucibles (W, Mo, Re), oxygen is not allowed. Generally, it is impossible to melt and grow In$_2$O$_3$ single crystals in iridium crucibles using state-of-the art melt growth techniques. Indeed there are no reports in scientific and technical literature on bulk In$_2$O$_3$ single crystals grown from the melt by any of the above-described techniques.

Therefore, most, if not all of the In$_2$O$_3$ applications mentioned above are based on thin films or layers, while those application areas, in which In$_2$O$_3$ single crystals would function as "self-standing" components for electronic devices or as substrates for homo- and heteroepitaxy still remain unexplored. E.g. epitaxy of In$_2$O$_3$ is performed on substrates prepared from other crystals, such as Y-stabilized ZrO$_2$, and such heteroepitaxy decreases crystalline perfection of In$_2$O$_3$ (such as dislocations, grain boundaries etc.), which may have a great impact on final device performance and lifetime. The availability of bulk In$_2$O$_3$ single crystals and substrates thereof would increase the range of its applications, especially at the industrial scale as well as improve the final device properties and their lifetime.

SUMMARY OF THE INVENTION

An object of the present invention is to provide a novel method for growing bulk In$_2$O$_3$ single crystals from the melt, which would allow the production of sufficiently large In$_2$O$_3$ single crystals, from which elements and substrates for different applications could be prepared.

Another object of the present invention is to provide an apparatus of a special design for utilizing said method for growing bulk $In_2O_3$ single crystals from the melt.

A further object of the present invention is to provide truly bulk $In_2O_3$ single crystals of high quality and large size, suitable for preparing elements and substrates for different applications, such as light emitting diodes, Schottky diodes, transparent transistors, transparent electrodes, and like, as well as having electrical and optical properties, which can be modified in a relatively wide range to meet particular requirements of a diversity of applications.

According to the first aspect of the invention a method for growing bulk $In_2O_3$ single crystals is provided. The method comprising the steps of:

i) providing into a growth chamber a thermal system comprising a noble metal crucible containing an initially non-conducting $In_2O_3$ starting material, a crucible thermal insulation surrounding the noble metal crucible at the bottom and the side, and an induction coil disposed around the noble metal crucible and coupled to a radio frequency (RF) generator, wherein the crucible wall thickness is not greater than the penetration depth of an eddy current induced in the noble metal crucible wall by the induction coil:

$$th \leq \delta = \sqrt{1/(\pi f \mu \sigma)}$$

where $\delta$ is the penetration depth (or skin depth), f is the generator frequency, $\mu$ is the permeability and $\sigma$ is the electrical conductivity of the noble metal crucible, the generator frequency being in the range between 1 kHz and 2 MHz;

ii) closing the noble metal crucible with a cover of the thermal system comprising at least a lid and having at least one evacuation passage for removing gaseous decomposition products of $In_2O_3$ from the interior of the noble metal crucible and keeping the interior of the noble metal crucible in communication with a growth atmosphere.

iii) introducing at least into the thermal system the growth atmosphere, which provides oxygen partial pressure between 0.005 and 0.2 bar around melting point of $In_2O_3$;

iv) heating up the $In_2O_3$ starting material by conduction and radiation from the noble metal crucible which in turn is inductively heated by the induction coil;

v) keeping at least inside the thermal system an oxygen partial pressure which is insufficient to avoid $In_2O_3$ decomposition, thus decomposing in controlled way the $In_2O_3$ starting material during heating up of the noble metal crucible, whereby increasing electrical conductivity of the $In_2O_3$ starting material with rising temperature;

vi) inducing, through the wall of the noble metal crucible, an eddy current in the $In_2O_3$ starting material, which becomes conducting around its melting point;

vii) melting of the $In_2O_3$ starting material by a combination of conductive, radiative and electrical heating, the latter caused by the eddy current induced directly in the $In_2O_3$ starting material;

viii) electromagnetically levitating at least a portion of the liquid $In_2O_3$ starting material and forming at the same time a neck portion of the liquid $In_2O_3$ extending from the levitating top portion of the melt towards a bottom portion of the liquid $In_2O_3$ starting material at the crucible bottom, or towards the crucible bottom if all the liquid $In_2O_3$ starting material was levitating;

ix) monitoring and detecting the melting point of the $In_2O_3$ starting material by at least one melting detection means;

x) cooling the noble metal crucible containing the liquid $In_2O_3$ starting material down to room temperature;

xi) solidifying during cooling down the liquid $In_2O_3$ material and forming at the same time one or more bulk $In_2O_3$ single crystals from the levitating and non-levitating portions of the liquid $In_2O_3$ starting material, which solidify on top and bottom sides of the liquid neck portion acting as a seed, or on the top side of the liquid neck portion if all liquid $In_2O_3$ material was levitating.

The present crystal growth method is based on levitation of the $In_2O_3$ melt inside the noble metal crucible, which is inductively heated up. During levitation a neck is formed, which acts as the seed for the liquid phase of $In_2O_3$, leading to its solidification in the form of the single crystal having the crystallographic orientation [100], [010], [001] or [111]. The levitation is possible due to controlled decomposition of $In_2O_3$ with rising temperature leading to a conversion of the $In_2O_3$ starting material from electrically non-conducting to electrically conducting material around its melting point, the conductivity being sufficient for electromagnetic coupling with the inductive coil through the wall of the noble metal crucible. Based on the crucial phenomena involved, we named this novel method the "Levitation-Assisted Self-Seeding Crystal Growth Method."

For sake of clarity, the terms listed below shall be understood for the purpose of the present description in the following way, unless otherwise stated.

A bulk single crystal is meant a single crystal object having similar size in all three directions of the three-dimensional space, each larger than about 2 mm (typically at least several mm). This is to distinguish bulk single crystals from crystalline films or layers or very thin plates, the one dimension of which is much smaller than two other ones, and from whiskers or needle-shaped crystals, two dimensions of which are much smaller than the third one.

A melt-grown single crystal or a single crystal grown from the melt is regarded as the single crystal solidified directly from the melt, not from the gas/vapor phase or flux.

An electrically non-conducting material is understood as the material being either electrically insulating or semiconducting with resistivity not exceeding $10^{-2}$ $\Omega$cm at room temperature. This is to distinguish such materials from typical conductors, such as metals, which typically have electrical resistivity of the order of $10^{-4}$-$10^{-6}$ $\Omega$cm at room temperature.

Preferably, between melting and cooling down, the method further comprises the step of holding the $In_2O_3$ starting material in the liquid phase for a predetermined time, to allow $In_2O_3$ to decompose and thus increase its electrical conductivity. Further, the method comprises additionally the step of overheating the $In_2O_3$ starting material in the liquid phase by maximum 5% in relation to the detected melting point, to allow $In_2O_3$ to decompose and thus increase its electrical conductivity.

Advantageously, the growth atmosphere provides oxygen, which changes in partial pressure from about 0 bar to about 0.1 bar, more preferably from about 0 bar to about 0.04 bar with rising temperature from room temperature to temperature in the range 1950° C.-2100° C. In a preferred embodiment of the present invention, the growth atmosphere comprises carbon dioxide ($CO_2$) at pressure between 0.1-10 bar. Carbon dioxide can be used alone or mixed with a noble gas or nitrogen and/or oxygen.

Desirably, the cooling rate of the noble metal crucible from the $In_2O_3$ liquid phase to the solidification point of the $In_2O_3$ liquid phase is between 100 K/h and 2000 K/h.

In a preferred design of the present crystal growth method, the cover of the thermal system comprises a lid having at least one evacuation passage in the form of at least one evacuation opening for removing gaseous decomposition products of $In_2O_3$ from the noble metal crucible, wherein the cross-section area of the evacuation openings is between 0.25% and 30%, more preferably between 0.25% and 10% of the crucible cross-section area.

In one embodiment, the induction coil is advantageously cylindrical, and the noble metal crucible is disposed within the induction coil in such a way, that at least part of the liquid $In_2O_3$ starting material is located above the middle plane of the induction coil.

In a preferred embodiment of the present method, the crucible wall thickness is between 0.5 and 3 mm, and the RF generator frequency is between 5 kHz and 100 kHz.

Advantageously, the melting detection means comprises at least one selected from the group consisting of: a pyrometer, a thermocouple, both adapted for detecting temperature of any part of the thermal system, a weighing unit adapted for detecting mass losses of the $In_2O_3$ starting material and a mass spectrometer for detecting decomposition products of the $In_2O_3$ starting material.

According to the second aspect of the invention there is provided an apparatus for growing bulk $In_2O_3$ single crystals from the melt. The apparatus comprises:

a growth chamber;

an RF generator;

an induction coil coupled to the RF generator and disposed inside the growth chamber;

a thermal system disposed within the coil in the growth chamber and being in communication with a growth atmosphere, which provides oxygen partial pressure between 0.005 and 0.2 bar around the melting point of $In_2O_3$, the thermal system comprising:

i) a noble metal crucible for containing an $In_2O_3$ starting material, the noble metal crucible being disposed within the induction coil and having wall thickness, which is not greater than the penetration depth of an eddy current induced in the noble metal crucible wall by the induction coil:

$$th \leq \delta = \sqrt{1/(\pi f \mu \sigma)}$$

where δ is the penetration depth (or skin depth), f is the generator frequency, μ is the permeability and σ is the electrical conductivity of the noble metal crucible, the generator frequency being in the range between 1 kHz and 2 MHz;

ii) a crucible thermal insulation surrounding a bottom and side wall of the noble metal crucible;

iii) a cover enclosing the noble metal crucible from the top, the cover having at least one evacuation passage adapted for removing gaseous decomposition products of $In_2O_3$ from the interior of the noble metal crucible and keeping the interior of the noble metal crucible in communication with the growth atmosphere, the cross section area of the at least one evacuation passage not exceeding 30% of the crucible cross section area; and at least one melting detection means adapted for detection melting of the $In_2O_3$ starting material.

Such inventive design of the growth apparatus enables to perform the crystal growth method according to the present invention. The crucial point of such growth apparatus is a relation between generator frequency and the wall thickness of the noble metal crucible as well as top insulation assuring very low temperature gradients inside the noble metal crucible to allow complete melting of the $In_2O_3$ starting material and sufficient at the same time to remove gaseous decomposition product of $In_2O_3$ avoiding a potential explosion due to internal pressure built up inside the crucible.

Desirably, the cover of the apparatus of the thermal system comprises a lid having at least one evacuation passage in the form of at least one evacuation opening for removing gaseous decomposition products of $In_2O_3$ from the noble metal crucible, wherein the cross-section area of the evacuation passages is between 0.25% and 30%, preferably between 0.25% and 10% of the crucible cross-section area.

The lid of the cover of the thermal system can be planar, concave or concave towards the interior of the noble metal crucible.

At least one evacuation passage of the cover is preferably formed by at least one opening in the lid. The at least one evacuation opening in the lid may have a different shape, such as circular, oval, polygonal, in the form of slots and like. The openings can be arranged on the lid in any way, they may occupy the central part of the lid, its periphery, between the central and peripheral parts, or in any combination of the above. Alternatively, or in addition to, the at least one opening in the lid, the at least one evacuation passage of the cover can be formed by at least one opening between the lid and top edge of the noble metal crucible.

In a preferred design of the apparatus, the cover further comprises a top thermal insulation disposed on the lid. In this embodiment, the top thermal insulation has at least one evacuation passage in the form of the evacuation channel being in communication with at least one evacuation opening in the lid and/or between the lid and the top edge of the noble metal crucible. The at least one evacuation channel of the top thermal insulation can be horizontal, vertical, inclined, straight, curved, or a combination thereof.

In yet another embodiment, the cover further comprises a noble metal afterheater, which is supported by the lid and surrounded by the top thermal insulation.

Desirably, the crucible wall thickness is between 0.5 mm and 3 mm, and the RF generator frequency is between 5 kHz and 100 kHz.

Preferably, the induction coil is cylindrical, and the noble metal crucible is disposed inside the induction coil in such a way, that at least a part of the liquid $In_2O_3$ starting material is located above the middle plane of the induction coil. Alternatively, the induction coil is conical in its bottom part, and/or has in the bottom part at least one extra turn to increase the levitation force. The induction coil may have different number of turns, such as 3, 4, 5, 6 or more. The individual turns may have equal or non-equal spacing. Moreover, the cross-section of the each individual turn can be circular, oval or rectangular. The noble metal crucible of the thermal system can be cylindrical, at least partly conical or rounded, at least partly barrel shaped or trapezoidal.

Advantageously, the melting detection means comprises at least one selected from the group consisting of: a pyrometer, a thermocouple, both adapted for detecting temperature of any part of the thermal system, a weighing unit adapted for detecting mass losses of the $In_2O_3$ starting material, and a mass spectrometer for detecting decomposition products of the $In_2O_3$ starting material.

According to the third aspect of the invention there is provided a bulk $In_2O_3$ single crystal obtained by the above-discussed crystal growth method. The as grown bulk $In_2O_3$ single crystal has the electrical resistivity between 0.01-0.03 Ωcm and the free electron concentration between $1-5 \times 10^{18}$ $cm^{-3}$, as measured by Hall effect.

According to the fourth aspect of the present invention, a bulk $In_2O_3$ single crystal obtained by the above-discussed crystal growth method of the present invention is provided. The bulk $In_2O_3$ single crystal being intentionally doped with one or more ferromagnetic element selected from the group consisting of Fe, Co, Ni, Mn and Cr, wherein the dopant is added to the $In_2O_3$ starting material at concentration between $10^{-6}$ mol % and 10 mol %.

According to a fifth aspect of the present invention there is provided a bulk $In_2O_3$ single crystal, obtained by the above-discussed crystal growth method of the present invention, having, when subjected to a first heat treatment in a non-reducing atmosphere at temperature between 400° C. and 1400° C. for time between 0.25 h and 300 h, the electrical resistivity between 0.02-5 Ωcm and the free electron concentration between $0.2$-$20 \times 10^{17}$ cm$^{-3}$, as measured by Hall effect. In this way the electrical resistivity of the bulk $In_2O_3$ single crystal can be significantly increased (or electron concentration decreased) as compared with the as-grown single crystal.

In addition to the first heat treatment, the bulk $In_2O_3$ single crystal can be further subjected to a second heat treatment in a hydrogen-containing atmosphere at temperature between 200° C. and 1200° C. for time between 0.25 h and 100 h. By doing so, the electrical resistivity of the bulk $In_2O_3$ single crystal between 0.005-0.03 Ωcm and the free electron concentration between $10^{18}$-$10^{19}$ cm$^{-3}$, as measured by Hall effect, can be achieved. Such heat treatment offers much smaller electrical resistivity or higher electron concentration of the bulk $In_2O_3$ single crystal as compared with the as-grown single crystal, without intentional doping.

According to the sixth aspect of the present invention, the melt grown bulk $In_2O_3$ single crystal, intentionally undoped or doped can be used as a substrate for homoepitaxy and heteroepitaxy. In the case of heteroepitaxy, $In_2O_3$ substrate can be used to deposit thereon GaN, AlN, InN, InGaN, AlGaN and AlInN.

The above-described method and apparatus are capable of producing truly bulk $In_2O_3$ single crystals from the melt, what has not been achievable by any of the prior art crystal growth methods despite of attempts made for several decades. The obtained $In_2O_3$ single crystals are large enough to prepare substrates for homoepitaxy and heteroepitaxy purposes. Furthermore, optical and electrical properties of the $In_2O_3$ single crystals obtained from the melt can be easily modified by post growth heat treatment processes, e.g. electrical conductivity can be set in the range of 3 orders of magnitude. Moreover, additional properties of the melt grown $In_2O_3$ single crystals can be further obtained or enhanced by intentional doping with different ions, depending on requirements.

In addition to the capability of obtaining truly bulk $In_2O_3$ single crystals, the method of the present invention is very cost effective as compared to other methods for growing oxide crystals from the melt, due to longer lifetime of the noble metal crucible and much shorter process time.

Yet another advantage of the present invention is a simplified growth station for growing $In_2O_3$ single crystals from the melt. It does not require any pulling and rotating mechanisms, neither for a crucible nor for a crystal, saving size and costs of such growth station. It requires only a growth chamber for the thermal system, a RF generator and a simple controller for regulating generator power.

More advantages and other features of the crystal growth method, apparatus and truly bulk $In_2O_3$ single crystals will be apparent from the detailed description of the embodiments in reference to the drawings.

BRIEF DESCRIPTION OF THE DRAWINGS

FIGS. 4A to 4D are vertical cross-section views of different embodiments of a thermal system according to the present invention;

FIGS. 6A to 6E are vertical cross-section views of a crucible of different configurations according to the present invention;

FIGS. 7A to 7E are vertical cross-section views of an induction coil of different configurations according to the present invention.

DETAILED DESCRIPTION OF THE EMBODIMENTS

Figure 1:
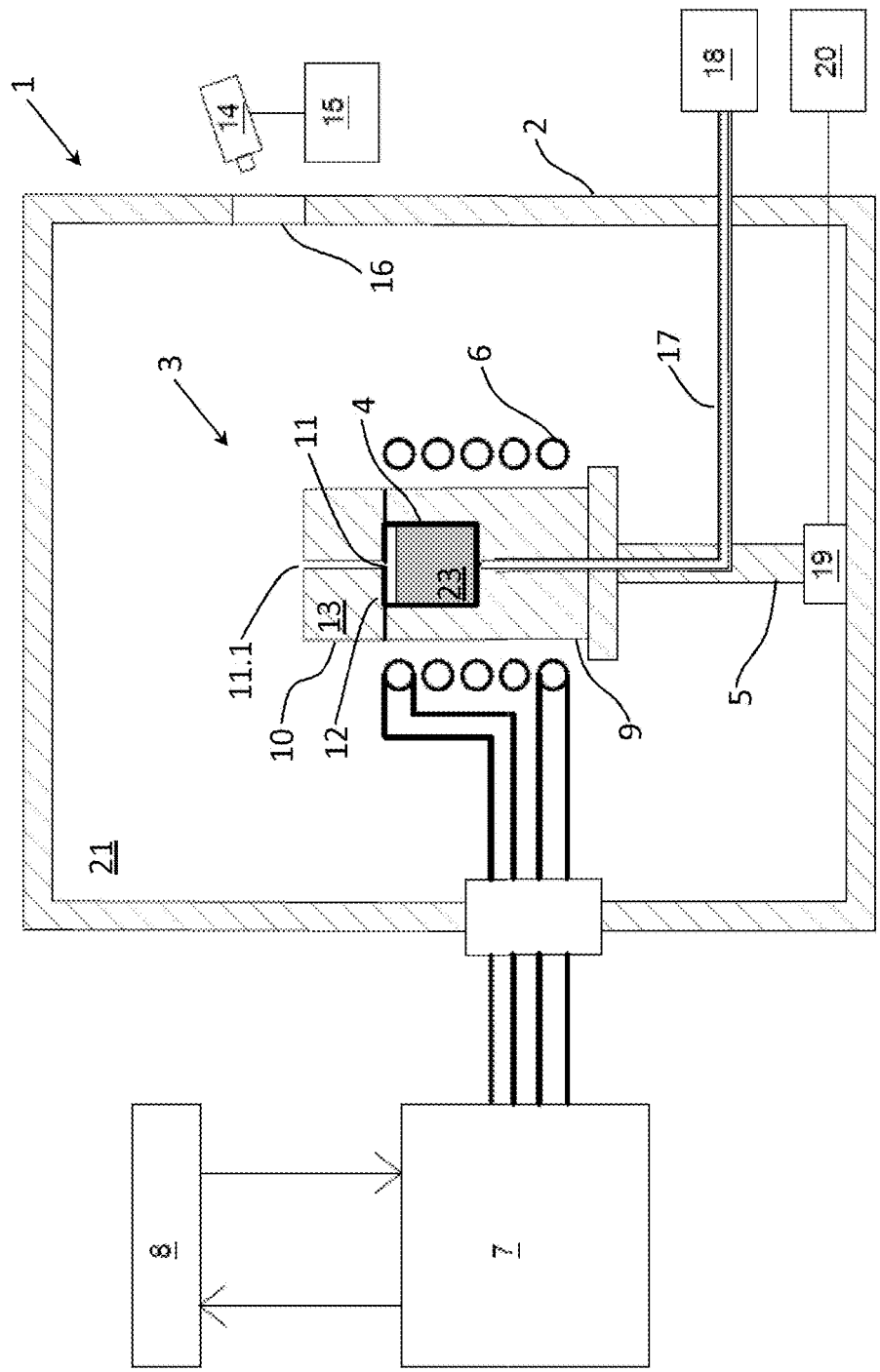
FIG. 1 is a schematic and partly sectional view of an apparatus for performing the method for growing truly bulk $In_2O_3$ single crystals from the melt according to the present invention.

An inventive method for growing truly bulk indium oxide ($In_2O_3$) single crystals from the melt will be described in connection with an apparatus schematically shown in FIG. 1. The apparatus 1 comprises a growth chamber 2, within which a thermal system 3 with a noble metal crucible 4, such as iridium or its alloy, is disposed on a support 5. In the art, the thermal system is also called a furnace. Around the thermal system 3 a radio-frequency induction coil 6 (RF coil) is disposed, which is coupled to a radio-frequency (RF) generator 7 being controlled by a control unit 8. The $In_2O_3$ starting material 23 to be molten is placed within the crucible 4.

The growth chamber 2 can be of any suitable size depending on the size of the thermal system 3. It is preferably made of a stainless steel material and it is water cooled. Other materials, such as aluminum can be used for the growth chamber 2 as well. The thermal system 3, which will be discussed in more detail hereinafter, includes the noble metal crucible 4, a crucible thermal insulation 9 surrounding the crucible bottom and its side wall, and a cover 10 enclosing the crucible 4 from the top with one or more evacuation passages 11, 11.1 to evacuate gaseous decomposition products of $In_2O_3$, which are in communication with the interior of the crucible 4. The crucible thermal insulation 9 includes a refractory material, such as alumina and/or zirconia and/or magnesia insulation being typically used in thermal systems used to grow high-melting point oxides (>1800° C.). As will be discussed hereinafter, the cover 10 may comprise a lid 12 with the evacuation passage 11, optionally an afterheater (not shown in FIG. 1), and a top thermal insulation 13 with the evacuation passage 11.1. The lid 12 can be made of a noble metal material, such as iridium or its alloy, or from a non-metal refractory material. The afterheater, if used, is made of a noble metal material, such as iridium or its alloy. The support 5, onto which the thermal system 3 is disposed, is preferably made of a thermally insulating material, such as alumina. The induction coil 6, which will also be discussed in detail hereinafter, consists of several turns, such as three, four, five, six or more. It may have a cylindrical or conical shape. A cross-section of each of individual turns of the induction coil 6 can be circular, oval, square or rectangular. The induction coil 6 is preferably made of copper, although other conducting metals can be used. The RF generator 7 has an operating frequency from about 1 kHz to about 2 MHz and power suitable to melt an appropriate volume of the $In_2O_3$ starting material 23 (which in turn depends on the crucible size), e.g. between 5 and 50 kW. The control unit 8 may include a computing device adapted to control the generator 7 that provides alternating current to the induction coil 6.

The apparatus 1 further comprises at least one melting detection means, which is capable of recognizing the melting process of $In_2O_3$ that takes place inside the noble metal crucible 4. Such means is required, since during operation it is not possible to visually detect the melting of $In_2O_3$ due to no visual access to the interior of the crucible 4. In one embodiment of the present invention, the melting detection means comprises a pyrometer 14 coupled with a pyrometer display unit 15 to measure, preferably continuously, temperature at a certain monitoring point of the thermal system 3. For that purpose, the growth chamber 2 is provided with a viewing window 16 that is transparent to visible and infrared radiation. The monitoring point can be located at any part of the furnace, but the most preferably it is located on a crucible wall or on the lid 12 covering the crucible 4. In this embodiment of the present invention, that part of the crucible 4 or the lid 12 to be monitored should be exposed. The pyrometer 14 can be any type of the pyrometers capable of measuring high temperatures, i.e. up to 2200° C. or more. More than one pyrometer can be used to monitor temperature in different locations of the thermal system 3.

In another embodiment of the present invention, the melting detection means comprises a thermocouple 17 coupled with a thermocouple display unit 18 to measure, preferably continuously, temperature at a certain monitoring point of the thermal system 3. Due to high operating temperature of the crucible 4, the most suited thermocouple is B-type. The thermocouple 17 may measure the temperature at any suitable point of the thermal system, as discussed above.

In yet another embodiment of the present invention, the melting detection means comprises a weighing unit 19 coupled with a weight display unit 20 to monitor mass loss from the thermal system 3 due to $In_2O_3$ decomposition. Although such detection means is not very precise (decomposition products will still deposit within the thermal system 3), melting of $In_2O_3$ can be estimated in this way quite well, since mass loss increases significantly upon melting, due much higher decomposition rate.

In the most preferred embodiment of the present invention, the apparatus has two or three melting detection means. Also other melting detection means can be used, such as a mass spectrometer detecting higher concentration of decomposition species (e.g. indium and oxygen) upon melting of the $In_2O_3$ starting material.

The growth of $In_2O_3$ single crystals requires a suitable growth (or protective) atmosphere 21 inside the thermal system 3 or inside the growth chamber 2, which is in a communication with the $In_2O_3$ starting material 23 to be melted. This atmosphere 21 will be discussed in more detail further below. The growth atmosphere 21 may continuously flow through the growth chamber 2, or can be enclosed within the growth chamber 2 without flowing in and out of the chamber 2 during the growth process. Further, any suitable pressure can be applied to the growth chamber 2, i.e. either underpressure or overpressure, e.g. from 0.1 to 100 bar. Alternatively, the growth atmosphere 21 may be directly injected into and extracted from the thermal system 3. In such embodiment, the thermal system 3 is gas-tight and isolated from the surrounding atmosphere in the growth chamber 2, which performs only protective and cooling actions.

Figure 2A:
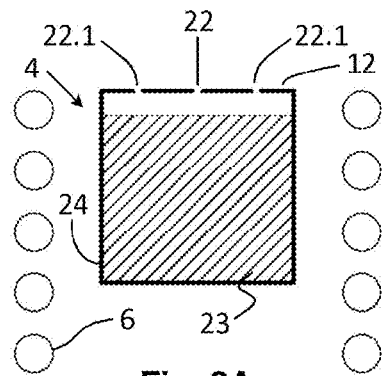
FIGS. 2A to 2E are sectional views of a crucible with an $In_2O_3$ starting material therein at different stages of heating up, melting and crystallizing, showing the principle of the present invention.
Figure 2B:
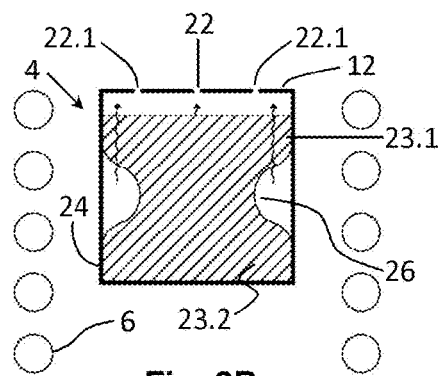
Figure 2C:
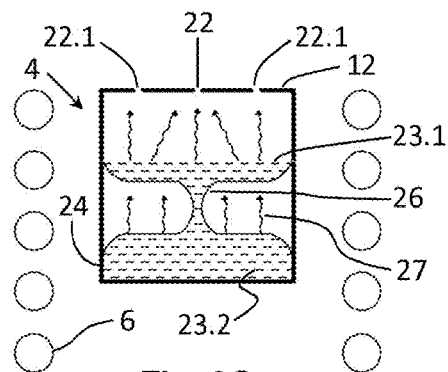
Figure 2D:
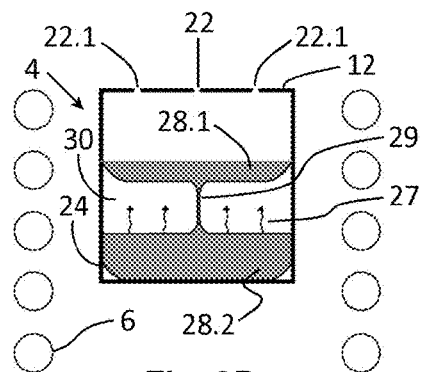
Figure 2E:
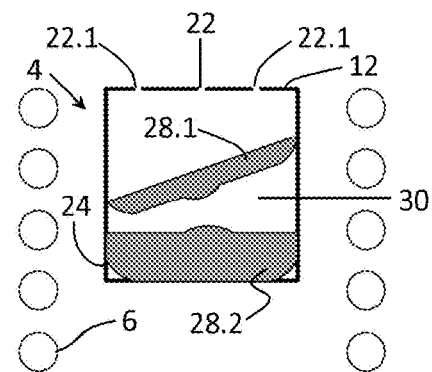
Figure 3:
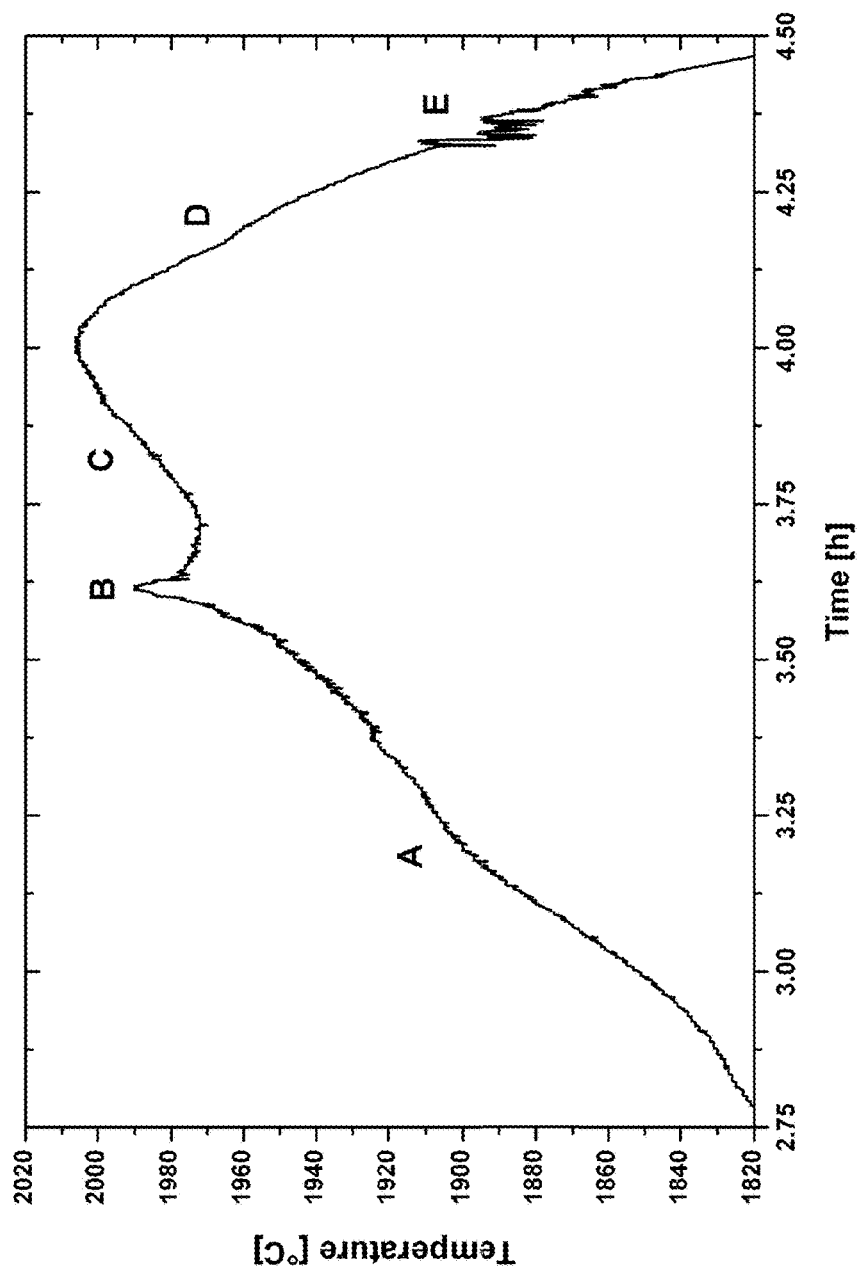
FIG. 3 is a plot showing temperature measurements versus time during heating up, melting and cooling down of an $In_2O_3$ starting material around its melting point according to the teaching of the present invention.

Now the inventive method for growing bulk $In_2O_3$ single crystals from the melt will be described in reference to FIG. 1 showing the growth apparatus, FIGS. 2A-2E, in which for sake of clarity only the noble metal crucible 4, the lid 12 with the evacuation passages in the form of the openings 22, 22.1, the induction coil 6 and the $In_2O_3$ starting material 23 are shown, and in reference to FIG. 3 showing temperature measurement on the top of the lid 12 prior melting, during melting and at early stage of cooling down.

Initially, the noble metal crucible 4, preferably made of iridium or iridium alloy, is placed in the crucible thermal insulation 9. Then, the $In_2O_3$ starting material 23 is loaded into the crucible 4, which is covered with the lid 12 and top thermal insulation 13. Next, the prepared thermal system 3 is placed within the induction coil 6. Loading of the $In_2O_3$ starting material 23 can be performed before placing the noble metal crucible 4 in the crucible thermal insulation 9. The order of the thermal system 3 preparation can be different and it does not constitute the essence of the present disclosure. The growth chamber 2 is closed and a vacuum is pumped to remove residual gases. After that, the growth atmosphere 21 is introduced into the growth chamber 2, which is in communication with the $In_2O_3$ starting material 23 inside the noble metal crucible 4 for the whole process time. The growth atmosphere 21 is either enclosed within the growth chamber 2 or flows through the growth chamber 2 at the flow rate between 1 and 200 l/h.

The thermal system 3 prepared in this manner (FIGS. 1, 2A) is heated up by the RF generator 7, which generates an alternating current within the induction coil 6, which in turn generate an electromagnetic field that induces an eddy current within the crucible side wall 24. The eddy current in the side crucible wall 24 heats up the noble metal crucible 4 by dissipated Joule heat. The hot crucible 4 in turn heats up the $In_2O_3$ starting material 23 within the crucible 4 by thermal conduction and radiation. With rising temperature, the $In_2O_3$ starting material 23 becomes chemically unstable and starts to decompose, roughly above 1000° C., depending on the growth atmosphere applied. Main decomposition products include indium (In) and oxygen (O). Indium has a high vapor pressure, therefore a portion of it, together with oxygen, will escape from the $In_2O_3$ starting material 23 in the gaseous form, but a small portion of indium will remain in the $In_2O_3$ starting material 23 as a small excess of metallic indium. As temperature rises, a decomposition rate of $In_2O_3$ increases and more metallic indium is produced within the $In_2O_3$ starting material 23 giving rise to its electrical conductivity. The concentration of metallic indium could not be measured in the melt, but it could be measured in the obtained $In_2O_3$ single crystals. The measurements revealed the presence of metallic indium in the concentration of about 30-80 ppm by volume. Near the melting point of $In_2O_3$, which is between 1950° C.-2000° C. according to our measurements, metallic indium concentration within the starting $In_2O_3$ material 23 becomes high enough to induce relatively high electrical conductivity. "Near" or "around" the melting point means temperature 1950° C.-2000° C. with a possible deviation of ±50 K from that range. In such conditions, the electromagnetic field from the induction coil 6 starts to penetrate also the electrically conducting $In_2O_3$ starting material 23, that is, its surface contacting the side crucible wall 24 and generate a levitation force, which lifts a top portion 23.1 of the $In_2O_3$ starting material 23, and as result a neck portion 26 is formed (FIG. 2B). As temperature rises (region A in FIG. 3), the $In_2O_3$ starting material 23 becomes more conducting and more electrical current may flow through it, which acts as an additional heat source. At this stage, the $In_2O_3$ starting material 23 is heated by three sources: thermal conductivity, radiation and electrical induction acting as the additional heat source. In such situation the whole $In_2O_3$ starting material 23 melts immediately, substantially at the same time. This can be observed as a sudden crucible flash, high temperature jump by several dozens of Kelvins, e.g. 30 K in region B in FIG. 3 (the temperature jump can be even 80 K depending on monitoring point) and also as much more intense decomposition (and a mass loss indicated by a weighing unit), which all indicate a liquid state of the $In_2O_3$ starting material 23. Sudden melting of $In_2O_3$ is associated with the electromagnetic coupling with the starting $In_2O_3$ material 23 through the noble metal crucible 4. Such behavior has not been observed for other oxides, the electrical conductivity of which is not sufficient for the electromagnetic coupling.

FIG. 2C shows the situation, where the whole $In_2O_3$ starting material 23 is in the liquid state. The $In_2O_3$ starting material 23 consists of the molten top portion 23.1, the molten bottom portion 23.2 and the molten neck portion 26 connecting the top and bottom portions 23.1 and 23.2. The top portion 23.1 is levitating above the bottom portion 23.2 by the electromagnetic levitation and likely does not contact the side crucible wall 24. In addition to that, high vapor pressure of decomposition products 27 (indicated by arrows) from the bottom portion 23.2 may facilitate and stabilize the electromagnetic levitation. In such configuration, the gaseous decomposition products 27 escape from the top portion 23.1 directly to evacuation openings 22, 22.1 and then to the ambient, while from the bottom portion 23.2 first around and/or through the top portion 23.1 before entering the evacuation passages (diffusion through the molten $In_2O_3$ is less effective). If an overheating is applied, as indicated by the region C in FIG. 3, a narrower neck will be formed, which has a positive impact on the later single crystal formation. The overheating should not be higher than about 5%, i.e. than about 100 K, since it would cause relatively high crystal degradation. Such high overheating can be applied, but for a very short time, like 5-30 min.

It is to be stressed, that the overheating depends on the temperature gradients within the metal crucible 24, which in turn are associated with the relative cross-section area (size) of the evacuation openings 22, 22.1 with respect to the crucible cross-section area. For larger cross-section area of the evacuation openings 22, 22.1 higher temperature gradients will be produced within the metal crucible 24, which will lead to a thicker neck portion 26. With the thicker neck portion 26 smaller $In_2O_3$ single crystals will be formed. In such situation the overheating is preferred to decrease the thickness of the neck portion 26. On the other hand, for smaller cross-section area of the evacuation openings 22, 22.1 lower temperature gradients will be produced within the metal crucible 24, which will lead to a thinner neck portion 26. In the case of low temperature gradients too high overheating may break the neck portion 26 in the liquid state and the solidification will take place without the neck portion 26. Lack of the neck portion 26 may result in a spontaneous solidification, that usually produces polycrystals (that is a number of small single crystals), although relatively large single crystal grains can be obtained as well. Therefore, the overheating, if preferred, should be adapted to the cross-section area of the evacuation openings 22, 22.1 in the lid 12.

If the weighing unit 19 is applied, a jump in mass loss rate can be noted, between 50% and 100% of the values just prior melting. The absolute values can be different depending on the furnace design, since most of the decomposition products 27 will deposit within the thermal system 3, which whole is weighted by the weighing unit 19. Therefore, only fast mass changes are important, but not absolute values. When a mass spectrometer is used, an increase in concentrations of the decomposition products, such as indium, can be detected.

Since $In_2O_3$ in the liquid state decomposes at high rate, typically 5-20 wt % per hour, the material should not be kept in the liquid state for too long. The next step in the present method is to cool down the liquid $In_2O_3$ material to room temperature (region D in FIG. 3). In the cooling down step, it is important, that the time of solidification of $In_2O_3$ (between regions B and E in FIG. 3) be quite short, otherwise most of the $In_2O_3$ starting material would decompose and evaporate. Once the liquid $In_2O_3$ has solidified, the cooling rate can be reduced. According to our experiments, liquid $In_2O_3$ crystallizes into solid (region E in FIG. 3) at temperature about 80 K-100 K below the melting point (i.e. such supercooling is required). Therefore, the cooling rate from the liquid state to the crystallization point of $In_2O_3$ should be higher than about 50 K/h, preferably higher than 100 K/h, more preferably higher than 200 K/h, such as 500 K/h, 1000 K/h or even 2000 K/h. Such high cooling rates can be achieved by a sudden change of the generator power to the value corresponding to or below the crystallization point. Once the liquid $In_2O_3$ has crystallized, any suitable cooling rate can be applied, between 50 K/h and 1000 K/h. The cooling rate can be either linear or non-linear or any combination thereof.

The crystallization process of the liquid $In_2O_3$ into bulk single crystals is quite fast, either at high or low cooling rates. As shown in FIG. 2D, the resulting bulk single crystal consists of a top single crystal 28.1, a bottom single crystal 28.2 and a neck crystal 29. Formation of single crystals 28.1 and 28.2 without using a single crystal seed is related to the presence of the neck portion 26, which acts as seed leading to preferential crystallographic orientation. The orientation of the top and bottom single crystals 28.1 and 23.2 is typically [111] or [100], [010], [001], the last three being equivalent for the cubic structure of $In_2O_3$. Both top and bottom single crystals 28.1 and 23.2 may comprise one single crystal block each. The thinner the neck portion 26, the higher probability for the single crystals 28.1 and 28.2 to form one single crystal block each. Once the top and bottom single crystals 28.1 and 28.2 were formed a vapor pressure of the decomposition products 27 will increase within the free space 30 between top and bottom single crystals 28.1 and 28.2, with substantially no evacuation passages, because a gap between the top single crystal and the inner crucible wall is typically blocked by condensation of the decomposition products 27. A pressure builds up within the free space 30 and lifts up the top single crystal 28.1 to create the evacuation passages for the gaseous decomposition products 27. Once this happens, very high temperature oscillations are observed, as indicated by the segment E in FIG. 3. If the neck crystal 29 is relatively thin, i.e. smaller than about 10% of the crucible diameter, the neck crystal 29 may be broken upon vapor overpressure and the top single crystal 28.1 will be separated from the bottom single crystal 28.2, and usually tilted, as shown in FIG. 2F. The tilting of the top single crystal 28.1 is due to lifting up force exerted by the vapor pressure built in the free space 30 to create for the decomposition products 27 the way for escaping out of the crucible.

It is to be noted, that the temperature profile shown in FIG. 3 is an example only and not intended to limit the present invention. Such temperature profile can be quite different depending on the monitoring point. E.g. if the temperature is monitored at or in the vicinity of the evacuation passage, high temperature oscillation (about ±5 K) will appear during melting at the region B in FIG. 3. Such high temperature oscillations can be an indication of the melting instead of the well distinguished peak. Also, the region C in FIG. 3 can be substantially constant or decrease, depending on overheating applied and on distance from the evacuation passages.

Once the thermal system 3 is cooled down to room temperature, the single crystals 28.1 and 28.2 together with the neck crystal 29, if present, can be removed from the noble metal crucible 4. As the result of internal forces acting on $In_2O_3$, such as electromagnetic levitation acting on the liquid $In_2O_3$ and vapor pressure acting on solid $In_2O_3$ after crystallization, the single crystal 28.1 and 28.2 (along with the neck crystal 29.2, if present) are substantially loose inside the metal crucible 4, therefore they can be easily removed without applying additional mechanical means, such as core drilling or other tools facilitating breaking the solid $In_2O_3$ within the crucible, which would increase a risk of crucible damage. Additionally, the metal crucible is subjected to much less deformation, since there is little contact between the melt and the crucible (levitation). Both features extend the crucible life time.

Yet another advantage of the inventive method is a short process time, typically between 7-20 hr from the beginning of heating to removing the single crystals from the crucible with good crystal quality and high process yield (a ratio of the crystal mass to the starting material mass), which can be as high as 20-50%. For prior art melt growth methods using a noble metal crucible that produce truly bulk oxide single crystals, the process time is at least several days for similar process yield. Taking into account the extended crucible lifetime and short process time (low energy usage and more growth runs can be performed within a unit time), no need for an external seed and associated rotating and pulling mechanisms, as well as saving time and resources on crucible cleaning, the present method is very cost effective as compared with other growth techniques in addition to the fact, it can provide truly bulk $In_2O_3$ single crystals, which are not achievable by any of the prior art crystal growth methods.

Below, detailed crystal growth conditions and parameters will be discussed.

Growth Atmosphere

The growth atmosphere, in which the crystal growth process takes place, is a very important factor, since it controls $In_2O_3$ decomposition. According to the present invention, some oxygen partial pressure, at least 0.005 bar ($5\times10^2$ Pa) must be present around melting point, otherwise the whole starting $In_2O_3$ material may decompose prior melting. On the other hand, too high oxygen partial pressure, higher than about 0.2 bar ($2\times10^4$ Pa) around melting point, may decrease the decomposition to the level, at which electrical conductivity of liquid $In_2O_3$ may not be sufficient for electromagnetic coupling and levitation. Therefore, according to the present invention the growth atmosphere should contain oxygen partial pressure between 0.005 bar and 0.2 bar around melting point of $In_2O_3$.

Such oxygen partial pressure can be provided in different ways. Oxygen at suitable concentration can be mixed with one or more neutral gases, such as helium, neon, argon, krypton and xenon and/or with nitrogen. Iridium oxidizes at low temperatures (below about 1200° C.), but it remains relatively intact at higher temperatures. In practice up to about 2% (0.02 bar) of oxygen can be used for iridium, which still causes an intensive iridium oxidation. Therefore, oxygen partial pressure within the gas mixture should not be higher than about 0.02 bar. An alternative and better solution can be obtained by using a growth atmosphere containing carbon dioxide ($CO_2$), which partly decomposes with increasing temperature into oxygen and carbon monoxide (CO). Moreover, $CO_2$ decomposes in such a way that the oxygen partial pressure is very low at low temperatures (below about 1200° C.) and iridium is substantially not oxidized. In this way, oxygen partial pressure can be provided at high temperatures higher than just by mixing oxygen with other neutral gases. $CO_2$ can be used alone or can be mixed with other neutral gases, such as above-mentioned noble gases and nitrogen. E.g. to provide 0.005 bar of oxygen partial pressure around melting point of $In_2O_3$ when using the growth atmosphere containing $CO_2$, the concentration of $CO_2$ in the gas mixture should be about 0.01%. By changing the ratio of $CO_2$ to other gases, any suitable oxygen partial pressure can be provided. If the growth atmosphere comprises only $CO_2$, it can provide oxygen partial pressure of about 0.04 bar around melting point of $In_2O_3$. To provide higher oxygen partial pressure, an overpressure can be applied. E.g. to provide 0.2 bar of oxygen partial pressure around melting point of $In_2O_3$ when using $CO_2$ as the growth atmosphere, 25-30 bar of overpressure must be applied.

Temperature Gradients and Evacuation Passages $In_2O_3$ decomposition is function not only of oxygen partial pressure, but also of temperature gradients. If too high temperature gradients are applied (as in the case of an exposed melt surface present in the Czochralski method) $In_2O_3$ might not melt even at high oxygen partial pressure. Therefore, the top crucible opening must be fully closed. On the other hand, if there are no passages for the gaseous $In_2O_3$ decomposition products, an internal pressure that would built up within the metal crucible, will lead at a certain point to an explosion. Thus, suitable evacuation passages for the decomposition products are required, while keeping low temperature gradients. According to our experimental data, the total surface area of the cross section of the evacuation passages should be between 0.25% and 30% of the surface area of the crucible's cross section. If the surface area of the cross section of the evacuation passages is lower than 0.25%, the evacuation passages may not be efficient to evacuate decomposition products and this may lead to the explosion due to accumulation the decomposition products within the crucible. On the other hand, if the surface area of the cross section of the evacuation passages is greater than 30%, the resulting temperature gradients would be too high and the starting $In_2O_3$ material may not fully melt and single crystals may not be obtained.

Generator Frequency

For the inventive $In_2O_3$ growth method, a radio frequency generator should be used, which provides the frequency between 1 kHz and 2 MHz. The RF frequency is one of the parameters responsible for the electromagnetic levitation of $In_2O_3$, since the penetration depth (or skin depth) of the electromagnetic field into an electrically conducting medium (metal crucible and $In_2O_3$ starting material once conducting) is related to the frequency in the following manner:

$$th \leq \delta = \sqrt{1/(\pi f \mu \sigma)}$$

where $\delta$ is the penetration depth (or skin depth), f is the frequency, $\mu$ is the permeability and $\sigma$ is the electrical conductivity. In the case of iridium, for 1 kHz the penetration depth is about 12 mm, while 2 MHz it is about 0.3 mm.

Noble Metal Crucible

As discussed above, $In_2O_3$ growth process requires some oxygen partial pressure and high operating temperatures exceeding 2000° C. There are several metals, which can be used as materials for crucibles to growth oxide crystals at high temperatures (above 1800° C.), such as iridium, molybdenum, tungsten and rhenium, or their alloys, but only iridium may withstand a limited oxygen partial pressure. Therefore, iridium-based metal is the most suitable material for the crucible to growth bulk $In_2O_3$ single crystal from the melt. The crucible can be made either of substantially pure iridium (above 99%) or an alloy of iridium and other element, such as platinum, rhenium, rhodium and like. In the case of the alloy, the concentration of iridium should be higher than about 90%.

Another important feature of the crucible is the wall thickness, through which the electromagnetic field penetrates into the $In_2O_3$ starting material contained in the metal crucible. The wall thickness should not be greater than the penetration depth of the electromagnetic field in the conducting medium, as discussed above. Therefore, the crucible wall thickness should be between 0.2-4 mm depending on the RF frequency, most preferably between 0.5 and 2.5 mm.

The metal crucible may have a different shape. It can be cylindrical, cylindrical with a conical or rounded bottom, barrel-shaped side wall and a combination thereof. The crucible bottom and wall thickness can be constant or may vary, e.g. the wall thickness may vary between 1 and 2 mm. In this way the penetration depth will be modulated along the crucible wall and so will the electromagnetic levitation force.

$In_2O_3$ Starting Material

The starting $In_2O_3$ material to be melted and crystallized into single crystals should not be conducting, that is, it can be an electrical insulator or semiconductor. In other words, the electrical resistivity of the starting $In_2O_3$ material should be higher than $10^{-2}$ $\Omega$cm. Very low electrical resistivity of the starting $In_2O_3$ material (such as lower than $10^{-3}$ $\Omega$cm), which can be considered as a degenerate semiconductor, may indicate that $In_2O_3$ has a noticeable excess of metallic indium prior melting, which can easily form an eutectic with iridium during heating up, what in turn may lead to crucible damage. In a preferred embodiment of the present invention, the $In_2O_3$ starting material is substantially an electrical insulator, or semiconductor the electrical conductivity (resistivity) of which can be controlled by applying a suitable oxygen partial pressure, as discussed above.

The $In_2O_3$ starting material can be in the form of powder, granules, ceramic, polycrystals (e.g. scraps from previous growth runs), or a combination thereof. In the case of powder, it is preferably dried, pressed and/or sintered and/or pressed prior loading into the metal crucible. The chemical purity of the $In_2O_3$ starting material should be as high as possible, preferably 99.99% (4N) or 99.999% (5N) or higher. Such high purity is preferred in order to minimize the concentration of residual impurities, some of them might have an impact on the growth process and/or electrical and optical properties of the resulting $In_2O_3$ single crystals. On the other hand, some impurities (dopants) can be intentionally added to the $In_2O_3$ starting material in order to obtain specific crystal properties, as it will be discussed further below.

Apparatus

An apparatus for growing bulk $In_2O_3$ single crystals from the melt has already been discussed in reference with FIG. 1. FIG. 4 shows exemplary embodiments of the inventive thermal system 103, which is capable of performing the above-discussed crystal growth method. The thermal system 103 includes a noble metal crucible 104, which is surrounded by a crucible thermal insulation 109. The crucible thermal insulation 109 is made of a refractory material, such as zirconia and/or alumina and/or magnesia insulation, which can withstand high temperatures up to 2100° C. In the exemplary embodiment of the present invention, the crucible thermal insulation 109 consists of one or more outer alumina tubes 109.1 filled with zirconia granules 109.2, within which the noble metal crucible 104 is disposed. For those skilled in art it should be obvious that other configurations for the crucible thermal insulation 109 can be utilized. Moreover, the crucible thermal insulation 109 can be designed from tubes, slabs and/or bricks and/or felts and/or thermal wool of the refractory material. Any combination of such or similar refractory materials and their forms can be used as well.

One of the key points of the thermal system 103 is the cover 110 enclosing the crucible 104 from the top. The cover 110 comprises at least a lid 112, placed on the crucible top. The lid 112 can be made of a noble metal material, preferably of the same material as the crucible 104, such as iridium or an iridium alloy. The lid 112 can also be made of a non-metal refractory material which can withstand high operating temperatures. Such non-metal refractory materials may include sapphire, magnesia, zirconia or other high melting point materials. The non-metal refractory materials for the lid 112 should be in the form of ceramic or single crystals.

The purpose of the lid 112 is to minimize thermal gradients within the crucible 104 and to evacuate gaseous products from the crucible interior caused by decomposition of an $In_2O_3$ starting material 123. Since the lid 112 operates as a thermal shield, its thickness and thermal properties have an impact on thermal gradients inside the crucible 104. The lid 112 may have any suitable thickness ranging from 0.5 mm to several centimeters. If the lid 112 is made of the noble metal material, its thickness may range between 0.5 and 3 mm, mostly for economical reason. In the case of the lid 112 made of the non-metal refractory material, its thickness may extend to several centimeters, e.g. between 2 and 8 cm. If the lid 112 is not thick enough (i.e. below about 2 mm), the cover 110 may preferably and additionally comprise a top thermal insulation 113, which is placed on the top of the crucible thermal insulation 109 and the lid 112. The top thermal insulation 113 can be made of any thermally insulating material as discussed above for the crucible thermal insulation 109. Also different configurations of the materials and their forms can be used, since the purpose of the top thermal insulation 113 is to further decrease thermal gradients within the crucible 104 and to facilitate evacuation of $In_2O_3$ decomposition products. In the exemplary embodiment of the present invention as shown in FIGS. 4A-4D, the top thermal insulation 113 is placed on the top of the crucible thermal insulation 109 and the lid 112. The top thermal insulation 113 can be formed by a single thermally insulating block (FIGS. 4A and 4B), by two or more concentric thermally insulating tubes and/or cylinders (FIG. 4C), or by a metal afterheater 131 surrounded by one or more thermally insulating tubes.

An important factor of the thermal insulation design is the presence of suitable evacuation passages to evacuate gaseous $In_2O_3$ decomposition products from the interior of the crucible 104. For that purpose, the lid 112 has one or more evacuation passages in the form of evacuation openings 111, which may have any shape and arrangement, wherein the surface area of the one or more openings 111 should be between 0.25% and 30% of the crucible cross-section area. Smaller surface area of the one or more evacuation openings 111 may lead to accumulation of the gaseous products within the crucible 104, which may cause an explosion at a certain point. On the other hand, larger surface area of the one or more openings 111 may produce too high temperature gradients, which in turn may lead to incomplete melting of $In_2O_3$ and too high decomposition rate.

The lid 112 may include one central opening, one or more side openings, one or more edge openings or a combination of any of such arrangements. The openings of the lid 112 may have any shape, such as, but not limited to circular, oval, rectangular, polygonal, slit or any combination of such shapes. The one or more openings can be arranged in any way, e.g. it/they may occupy the central area and/or along the periphery and/or between the periphery and the central area of the lid 112. They can be arranged either symmetrically or non-symmetrically.

Figure 5A:
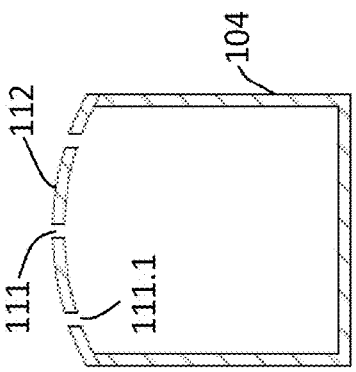
FIGS. 5A to 5D are vertical cross-section views of a crucible with a lid of different configurations according to the present invention.

The lid 112 may have any suitable shape, such as but not limited to planar (FIG. 5A), convex (FIG. 5B) or concave (FIGS. 5C and 5D) towards interior of the crucible 104, spherical (FIGS. 5B and 5C), conical (FIG. 5D) or like. In each case the lid 112 can be wavy in such way, that it does not fully contact the crucible top edge (FIG. 6E). In this way, alternative or additional side openings 111.3 can be formed between the lid 112 and the top edge of noble metal crucible 104. The advantage of the side openings 111.3 lies in the lower probability of contamination of the $In_2O_3$ starting material from the top thermal insulation, if present.

If the top thermal insulation 113 is used, it should also include at least one evacuation passage (FIGS. 4A-4D) being in communication with the at least one opening 111, 111.1, 111.3 in the lid 112. Such one or more evacuation passages can be formed by one or more horizontal evacuation channels 111.4 (FIG. 4A), one or more vertical evacuation channels 111.5, 111.6 (FIGS. 4C and 4D) or a combination of both vertical and horizontal evacuation channels (FIG. 4B). The evacuation channels 111.4, 111.5, 111.6 may have any shape, e.g. the evacuation channels can be straight or curved, or angular. The vertical evacuation channels 111.6 can be formed, for example, by angular slits between two insulating components, such as concentric tubes (FIG. 4C). The channels may also have any cross section, such as, but not limited to circular, semicircular, oval, rectangular, polygonal and like. In yet another embodiment of the present invention, as shown in FIG. 4D, the cover 110 may include the noble metal afterheater 131, which is preferably supported on the lid 112 and surrounded by the top thermal insulation 113. The afterheater 131 is heated inductively by the induction coil 106.

As discussed in reference to FIG. 1, the apparatus for growing bulk $In_2O_3$ single crystals from the melt includes melting detection means.

FIG. 6 shows examples of shapes of the noble metal crucible 104 used to growth $In_2O_3$ single crystals from the melt. It may have a cylindrical crucible wall 124.1 (FIG. 6A) and a flat crucible bottom 125.1, which is easy to fabricate and allows a simple crystal removal. For the barrel-shape crucible 124.2 (FIG. 6B) there is a better coupling with the electromagnetic field at the more convex crucible wall producing higher levitating force, and the higher levitation force can be shifted towards the crucible bottom by cylindrical-barrel-shaped wall 124.3 (FIG. 6C) in order to increase the amount of levitating $In_2O_3$ starting material. Moreover, the shapes of FIGS. 6B and 6C produce lower temperature gradients within the noble metal crucible 104 and thus lower decomposition of $In_2O_3$. The flat crucible bottom 125.1 is inductively heated less effectively than the crucible wall 124, therefore to decrease temperature gradients at the central area of the crucible bottom a spherical or conical crucible bottom 125.2, 125.3 can be used (FIG. 6D). In yet another embodiment, a crucible 104 with a trapezoidal wall 124.4 (FIG. 6E) can be used to adapt the conical shape of the induction coil. Such crucible shape facilitates removal of the single crystals. Those skilled in the art will appreciate that any combination of the exemplary crucible shapes, or yet other shapes are possible to obtain higher levitation force and lower temperature gradients within the noble metal crucible 104.

The induction coil 106 can be cylindrical (FIG. 7A), conical or a combination of both (FIG. 7B). It can be made of one, two or more layers of coil turns 106.1, 106.2 (FIG. 7C), the extra coil turn 106.2 being disposed at the bottom part of the coil. Also the conical coil may have extra coil turns at its bottom part. The conical shape as well as extra layers or turns 106.2 of the coil 106 may increase electromagnetic levitation force allowing levitation of larger amount of liquid $In_2O_3$. In this case a noble metal crucible can be located at different positions within the coil, also below the mid-plane thereof. The distance between individual coil turns can be the same or different, e.g. as shown in FIG. 7D, the distance between bottom coil turns is smaller than between top ones. Instead of one, two or more separate induction coils 106.3, 106.4 can be used, as indicated in FIG. 7E. Such coil configuration can be utilized when the active noble metal afterheater is used. A cross-section of each individual coil turn can be circular (as in the drawing), rectangular, oval or mixed. Also the number of coil turns may vary, depending on the crucible size, and can be 2, 3, 4, 5, 6 or more.

EXAMPLES

Example 1

A cylindrical iridium crucible (FIG. 6A) of 40 mm diameter and 40 mm height and a wall thickness of 1.5 mm was used. The $In_2O_3$ starting material was powder of 99.99% purity and the amount loaded into the crucible was 130 g. It was an electrically insulating material. The growth atmosphere was $CO_2$ at 1 bar pressure, which provided an oxygen concentration from about 0% to about 3-4% (about 0.03-0.04 bar) between room temperature and melting point of $In_2O_3$. The thermal system shown in FIG. 4D and the flat iridium lid (FIG. 5A) with one central opening were used, wherein the cross section area of the evacuation passages was about 30% of the cross section area of the crucible. The induction coil was cylindrical and consisted of two parts as shown in FIG. 7E, wherein the generator frequency was 30 kHz. The middle plane of the crucible was located above the middle plane of the crucible coil. The heating rate was about 100 K/h, while the cooling rate was in average 200 K/h. The melting point was monitored by a pyrometer and a crucible weighing unit.

As the result, the In$_2$O$_3$ starting material was molten at the neck and bottom portions, but not at the top portion. The neck portion diameter was about 50% of the crucible diameter and an In$_2$O$_3$ single crystal of about 13 g (10 wt % of the starting material) was obtained in the bottom portion. This example shows an upper limit for the cross section area of the evacuation passages in the lid and corresponding temperature gradients. Larger area of the evacuation passages may cause problems with melting and obtaining any In$_2$O$_3$ single crystals.

Example 2

Figure 5B:
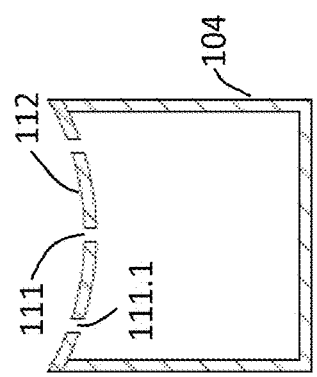

The applied apparatus and conditions were the same as in Example 1, but the iridium lid was concave as shown in FIG. 5B, with the central and side evacuation passages, wherein the cross section area of the evacuation passages of was about 2% of the cross section area of the crucible.

The whole In$_2$O$_3$ starting material was fully molten and the neck diameter was about 25% of the crucible diameter. An In$_2$O$_3$ single crystal of [100] orientation in the vertical direction and total weight of about 30 g (about 23 wt % of the starting material) was obtained.

Example 3

Apparatus and conditions were the same as in Example 2, but the middle plane of the crucible was located below the middle plane of the crucible coil, that is, the level of the molten material was below the middle plane of the coil.

The In$_2$O$_3$ starting material was fully molten, but substantially no neck was formed indicating that no levitation was present. However, several In$_2$O$_3$ single crystal grains of about 15 g were obtained (about 11.5 wt % of the starting material).

Example 4

The barrel-like iridium crucible (FIG. 6B) of 40-44 mm diameter with rounded bottom (as shown by dashed lines in FIG. 6D), 40 mm height and wall thickness of 1.2 mm was used. The In$_2$O$_3$ starting material was powder of 99.99% purity and the amount loaded into the crucible was 150 g. It was an electrically insulating material. The growth atmosphere was CO$_2$ at pressure 1 bar. The thermal system similar to that of FIG. 4C was used. The wavy iridium lid (FIG. 5E) covering the crucible was utilized, wherein the cross section area of the evacuation passages was about 10% of the cross section area of the crucible and the evacuation passages in the top thermal insulation were formed be angular slits between thermally insulating tubes. The coil was cylindrical as shown in FIG. 7A, wherein the generator frequency was 30 kHz. The middle plane of the crucible was located above the middle plane of the coil. The heating rate was about 200 K/h, while the cooling rate was in average 300 K/h.

The In$_2$O$_3$ starting material was fully molten and the neck diameter was about 40% of the crucible diameter. An In$_2$O$_3$ single crystal of about 30 g (about 20 wt % of the starting material) was obtained.

Example 5

The apparatus and conditions of Example 4 were applied, but the starting material was additionally overheated after melting by about 3.5% (i.e. about 70 K).

The In$_2$O$_3$ starting material was fully molten and the neck diameter was about 30% of the crucible diameter. An In$_2$O$_3$ single crystal of about 75 g (about 50 wt % of the starting material) and [100] orientation in vertical direction was obtained. This is a very preferred mode of the present invention.

Example 6

The apparatus and conditions were the same as in Example 5, wherein the crucible position within the induction coil was higher, i.e. the top of the crucible was extended a few millimeters above the coil to generate higher levitation force. The cooling rate was in average about 1000 k/h.

Two separate single crystals of about 75 g (about 50 wt % of the starting material) were obtained indicating that the neck portion was very thin at the liquid state of In$_2$O$_3$ and it was broken after solidification as the result of internal vapor pressure in the space between the top and bottom single crystals, which pushed the top single crystal upwards and broke the seed. This example shows further preferred mode of the present invention.

It is to be noted that in other experiments, if the neck portion was already broken at the liquid state of In$_2$O$_3$, e.g. due to too low temperature gradients and/or high overheating and/or too high levitation force, the liquid solidified in a spontaneous manner leading usually to polycrystal formation. Although in these polycrystals large bulk single crystal grains could be found (even as large as several millimeter), such situation is not the most preferred as compared with the embodiments, where a thin neck portion is maintained until solidification occurs.

Example 7

The barrel-like iridium crucible (as shown in FIG. 6B) of 40-44 mm diameter with rounded bottom, 40 mm height and wall thickness of 1.2 mm was used. The In$_2$O$_3$ starting material was powder of 99.99% purity and the amount loaded into the crucible was 150 g. It was an electrically insulating material. The growth atmosphere was CO$_2$ at pressure of 1 bar. The thermal system shown in FIG. 4A was used. The conical iridium lid (as shown in FIG. 5D) covering the crucible was used and the cross section area of evacuation passages was 0% of the cross section area of the crucible. The cylindrical coil was as shown in FIG. 7A, wherein the generator frequency was 30 kHz. The middle plane of the crucible was located above the middle plane of the crucible coil. The heating rate was about 200 K/h, while the cooling rate was in average 500 K/h.

The whole In$_2$O$_3$ starting material was molten. However, there was an explosion in the furnace during cooling just after solidification due to accumulation of gaseous products within the crucible, and the already formed In$_2$O$_3$ single crystals were partly destroyed.

Example 8

The apparatus and conditions were the same as in Example 7, wherein the cross section area of evacuation passages of the iridium lid with one central opening was about 0.25% of the cross section area of the crucible.

The whole In$_2$O$_3$ starting material was molten and two separate single crystals were obtained, i.e. the neck was very thin and broke during solidification. Two In$_2$O$_3$ single crystals of [111] orientation in the vertical direction and weight of about 30 g (20 wt % of the starting material) were obtained. In this case a small explosion was observed indicating that the cross-section surface area of the evacuation passages in the lid of 0.25% is rather the lowermost limit.

Example 9

The barrel-like iridium crucible (as shown in FIG. 6B) of 40-44 mm diameter with rounded bottom, 40 mm height and wall thickness of 1.2 mm was used. The $In_2O_3$ starting material was powder of 99.99% purity and the amount loaded into the crucible was 150 g. It was an electrically insulating material. The growth atmosphere was $CO_2$ at pressure of 1 bar. The thermal system of in FIG. 4A was used. The weavy iridium lid (as shown in FIG. 5E) covering the crucible was used and the cross section area of evacuation passages was about 10% of the cross section area of the crucible. A cylindrical coil as shown in FIG. 7A, wherein the generator frequency was 30 kHz, was used. The middle plane of the crucible was located above the middle plane of the crucible coil. The heating rate was about 250 K/h, while the cooling rate was in average 500 K/h.

The same results as in Example 6 were obtained, i.e. two separate single crystals of about 75 g (about 50 wt % of the starting material) and [100] orientation in the vertical direction were obtained. This mode of the present invention is very preferred.

Example 10

Figure 5C:
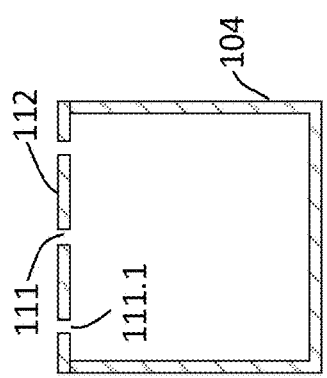
Figure 5D:
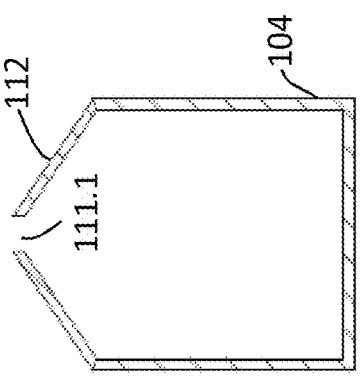
Figure 5E:
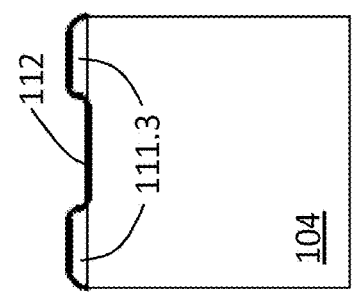
FIG. 5E is a side view of the crucible with the lid of yet different configuration.

The same apparatus and conditions as in Example 9 were applied, wherein the convex iridium lid as shown in FIG. 5C with the cross section area of evacuation passages about 10% of the cross section area of the crucible was used. Additionally the overheating of 1.8% was applied.

Very similar results to that of Example 9 were obtained, and the crystal orientation was [111] in the vertical direction. Also this mode of the present invention is highly preferred.

In other experiments $CO_2$ under pressure of 0.5 and 5 bar was applied. In each case single crystals of $In_2O_3$ were obtained. However, due to a higher decomposition rate in the case of lower pressure and smaller levitation force in the case of overpressure (acting against levitation force), smaller $In_2O_3$ single crystals were obtained as compared with Examples 6, 9 and 10, typically 10-25 wt % of the $In_2O_3$ starting material. Good and large $In_2O_3$ single crystals were also obtained in other experiments utilizing a generator frequency of 10 kHz, as well as other iridium crucible shapes, as shown in 6D and 6E.

The process time for one growth run is typically between 7 h and 20 h. Depending on holding time of the liquid $In_2O_3$ starting material (that is between the melting point and crystallization point). Material loss due to decomposition and thus evaporation is typically between 20 wt % and 40 wt % of the $In_2O_3$ starting material. Therefore the single crystal weight is limited to the remaining weight of the $In_2O_3$ starting material, and it is typically 10-50 wt % of the weight of the $In_2O_3$ starting material, depending on the thermal system size, including the crucible size, and growth conditions. Although the above examples relate to the iridium crucible of 40 mm diameter, those skilled in the art will appreciate, that the crucible and thus the thermal system or its particular components can be scaled-up (or scaled-down) using the same teachings of the present disclosure.

Using the above-described method and apparatus according to the present invention truly bulk $In_2O_3$ single crystals were obtained. The as-grown $In_2O_3$ single crystals are dark brown in color due to a minor excess of metallic indium formed in the melt during decomposition process, which forms nano- and/or microcluster causing some absorption in the visible range. This absorption can be easily removed by a suitable heat treatment, as discussed further below. Electrical properties of the as-grown $In_2O_3$ single crystals, which were obtained by Hall effect measurements using indium-gallium ohmic contacts, are summarized in Table 1.

TABLE 1

| Resistivity [Ω cm] | Free electron concentration [$cm^{-3}$] | Electron mobility [$cm^2 V^{-1} s^{-1}$] |
|---|---|---|
| 0.01-0.03 | 1-5 × $10^{18}$ | 130-150 |

Electrical and optical properties of the melt grown bulk $In_2O_3$ single crystals can be tuned in a wide range by one or more suitable heat treatments, which in a combination with a suitable annealing atmosphere lead to oxidizing or reducing, and diffusing processes within the solid $In_2O_3$ single crystals. Since the crystal growth process from the melt proceeds at very high temperature (about 1950-2000° C.), certain intrinsic defects are formed, mostly by $In_2O_3$ decomposition, including indium interstitials and/or indium nano- or microclusters and oxygen vacancies and/or cluster thereof. The defects seem to be metastable, therefore they are sensitive to heat treatments. Since the intrinsic defects of the melt-grown bulk $In_2O_3$ single crystals are at least partly responsible for material properties, electrical and optical properties of the $In_2O_3$ single crystals can be modified in a wide range.

The heat treatments of bulk $In_2O_3$ single crystals obtained from the melt can be performed in an oxidizing annealing atmosphere (such as oxygen, air, carbon dioxide and like), and/or neutral annealing atmosphere (such as noble gases, nitrogen and like), and/or vacuum, and/or in a reducing annealing atmosphere (such as containing hydrogen or ammonia and like).

The electrical resistivity of the melt-grown bulk $In_2O_3$ single crystals can be increased, with a quite accurate tuning, by a first heat treatment in non-reducing annealing atmosphere (i.e. neutral or oxidizing) by up to two orders of magnitude at temperatures between 400° C. and 1400° C. and time durations between 0.25 h-300 h, depending on the crystal thickness. The corresponding free electron concentration decreases in a similar manner as the resistivity increases. Alternatively, tuning of electrical resistivity (and the corresponding free electron concentration) can be performed at a fixed temperature just by changing annealing time. The first heat treatment may be carried out in two or more separate steps in the same or different atmospheres (e.g. oxidizing followed by neutral atmosphere).

Wide ranges of electrical properties of melt-grown bulk $In_2O_3$ single crystals from the present invention, which can be obtained after the first heat treatment in non-reducing atmosphere (i.e. oxidizing or neutral) at temperatures between 400° C.-1400° C. are listed in Table 2.

TABLE 2

| Resistivity [Ω cm] | Free electron concentration [$cm^{-3}$] | Electron mobility [$cm^2 V^{-1} s^{-1}$] |
|---|---|---|
| 0.02-5 | 0.2-20 × $10^{17}$ | 130-180 |

As described above, the first heat treatment in non-reducing atmosphere leads to the increase of the electrical resistivity. For some applications, such as transparent conducting electrodes, the electrical resistivity should be as low as possible. According to the present invention, it is possible to obtain a low electrical resistivity of the melt-grown bulk $In_2O_3$ single crystal by multiple, e.g. a double or triple heat treatment. The first heat treatment should be performed in a non-reducing atmosphere to remove brownish coloration. The second heat treatment should be carried out in the hydrogen-containing atmosphere leading to the higher free electron concentration while keeping high optical transparency. The second heat treatment involves temperatures between 200° C. and 1200° C., and annealing time between 0.25 h-100 h, depending on the sample thickness and temperature. Also the second heat treatment can be performed in one or more separate steps under the same or different atmospheres, e.g. $(x)H_2+(1-x)Ar$, where x varies between 0.01 and 0.05. For higher temperatures shorter annealing times should be applied, otherwise the crystal quality deteriorates due to decomposition.

Electrical properties of bulk $In_2O_3$ single crystals of the present invention after the first heat treatment (non-reducing annealing atmosphere) and second heat treatment (hydrogen-containing atmosphere) are listed in Table 3.

TABLE 3

| Resistivity [$\Omega$ cm] | Free electron concentration [$cm^{-3}$] | Electron mobility [$cm^2 V^{-1} s^{-1}$] |
| --- | --- | --- |
| 0.005-0.03 | $10^{18}$-$10^{19}$ | 100-150 |

The melt-grown bulk $In_2O_3$ single crystals according to the present invention have a high capability of changing (tuning) electrical properties in a very wide range, just by one or more suitable heat treatments. In this way it is possible to modify electrical resistivity and free electron concentration substantially within 3 orders of magnitude, while keeping good transparency in the visible and near infrared (IR) spectra. In each case a cut-off wavelength of the transmittance is located at 440±10 nm and upon one or more heat treatments a very sharp absorption edge can be obtained, beyond which bulk $In_2O_3$ single crystals are transparent over the visible and near IR spectra.

If desired, melt grown bulk $In_2O_3$ single crystals of the present invention can be intentionally doped with one or more elements to further modify electrical and optical properties and/or to induce other properties, such as ferromagnetism. The doping can be performed by adding a required element to the $In_2O_3$ starting material in the form of an oxide, while utilizing the above-described growth method and apparatus. The doping can be single or multiple, and the dopant concentration may vary from about $10^{-5}$ mol % to about 10 mol %. To further enhance the free electron concentration up to about $10^{20}$-$10^{21}$/$cm^3$, bulk $In_2O_3$ single crystals are preferably doped with one or more $4^+$, $5^+$ or $6^+$ metal or non-metal ions substituting $In^{3+}$ ions, such as, but not limited to tin (Sn), germanium (Ge), silicon (Si), antimony (Sb), titanium (Ti), zirconium (Zr), hafnium (Hf), vanadium (V), niobium (Nb), tantalum (Ta), molybdenum (Mo), manganese (Mn) and like. On the other hand, to decrease the free electron concentration or possible to obtain p-type conductivity, bulk $In_2O_3$ single crystals are preferably doped with one or more 1+ or 2+ metal or non-metal ions substituting $In^{3+}$ ions, such as, but not limited to lithium (Li), magnesium (Mg), calcium (Ca), strontium (Sr), barium (Ba), cobalt (Co), nickel (Ni), copper (Cu) and zinc (Zn). Oxygen ions $O^{2-}$ on the other hand can be substituted by 1- non-metal ions such elements as fluorine (F), chlorine (Cl), bromine (Br) and iodine (I) to increase the free electron concentration. Most of the dopants can be added to the $In_2O_3$ starting material in the form of oxides, while gaseous dopants can be provided within the growth atmosphere.

In addition to electrical properties, ferromagnetic properties can be obtained for melt grown bulk $In_2O_3$ single crystals by doping melt-grown bulk $In_2O_3$ single crystals with one or more of the following elements: Fe, Co, Ni, Mn and Cr with the concentration ranging from about $10^{-6}$ mol % to about 10 mol %, which are added to the $In_2O_3$ starting material in the form of oxides.

Melt grown bulk $In_2O_3$ single crystals according to the present invention have high structural quality, which was confirmed by rocking curve measurements (full width at half maximum much smaller than 100 arcsec, typically 20-60 arcsec), neutron diffraction and high resolution transmission electron microscopy. The high structural quality in a combination with chemical stability of the melt grown bulk $In_2O_3$ single crystals according to the present invention are the basic criteria for substrates prepared from bulk single crystals. The chemical stability of the melt grown bulk $In_2O_3$ single crystals was checked by thermogravimetry measurements versus different atmospheres and temperatures. Melt-grown bulk $In_2O_3$ single crystals are chemically stable (i.e. they do not decompose) up to about 1200-1300° C. for the non-reducing atmosphere, up to about 1000° C. for vacuum and to about 600° C. for highly reducing atmosphere.

The substrates prepared from the melt-grown bulk $In_2O_3$ single crystals, after wafering and high quality polishing, can be used for any epitaxial techniques, such as, but not limited to Molecular Beam Epitaxy (MBE), Metal-Organic Chemical Vapor Deposition (MOCVD), Pulsed Laser deposition (PLD), Sputtering, Electron Beam Evaporation and like. Substrates prepared from melt-grown bulk $In_2O_3$ single crystals can also be used as seeds for other growth techniques, such as, but not limited to Chemical Vapor Transport (CVT), Physical Vapor Transport (PVT) and like.

For epitaxial thin films or layers, substrates from melt-grown bulk $In_2O_3$ single crystals can be used for both, homoepitaxy (for depositing $In_2O_3$ thin films or layers) and heteroepitaxy (for depositing other materials). In the case of heteroepitaxy, $In_2O_3$ substrates can be used for oxide compounds as well as for nitrides, such as, but not limited to GaN, AlN, InN, InGaN, AlInN and like.

The melt-grown bulk $In_2O_3$ single crystals according to the present invention can be used in a diversity of applications, such as, but not limited to: transparent electrodes for flat panel displays and photovoltaic applications, light emitting diodes, solid-state lasers, energy efficient windows, transparent field-effect transistors (such as MISFET and MOSFET), Schottky diodes and high temperature gas sensors (electrical properties change on oxidizing and reducing conditions) and for multiferroic and spintronic applications (e.g. as substrates).

The method and apparatus according to the present invention are also suitable for growing single crystals of other conducting and semiconducting oxides, which decompose with rising temperature and thus increase their electrical conductivity, allowing the liquid phase to be levitated. Examples of such materials include, but not limited to ZnO, NiO, CdO, $SnO_2$, $Ga_2O_3$ or their compounds. Since high electrical conductivity of a molten material is required for the electromagnetic levitation, these materials may require different growth conditions, i.e. different oxygen partial pressure, temperature gradients, generator radio frequency, crucible wall thickness etc., as compared with $In_2O_3$ according to the teaching of the present invention.

It is important to note that the operating conditions, arrangement and design of the methods and apparatus as shown in the various embodiments are illustrative only. Although only exemplary embodiments of the present inventions have been described in detail in this disclosure, those skilled in the art will readily appreciate that many modifications are possible, e.g., variations in sizes, dimensions, structures, shapes and proportions of the various elements, values of parameters, mounting arrangements, use of materials, orientations, etc. without materially departing from the novel teachings and advantages of the subject matter recited in the claims. Accordingly, all such modifications are intended to be included within the scope of the present invention as defined in the appended claims. Other substitutions, modifications, changes and omissions may be made in the design, operating conditions and arrangement of the preferred and other exemplary embodiments without departing from the scope of the present inventions.

REFERENCE NUMERAL LIST

1 Crystal growth apparatus
2 Growth chamber
3 Thermal system
4 Noble metal crucible of the thermal system 3
5 Thermal system support
6 RF induction coil
7 RF generator
8 Control unit
9 Crucible thermal insulation of the thermal system 3
10 Cover of the thermal system 3
11 Evacuation passage of the lid 12
11.1 Evacuation passage of the top thermal insulation 13
12 Lid of the cover 10
13 Top thermal insulation of the cover 10
14 Pyrometer
15 Pyrometer display unit
16 Viewing window of the growth chamber 2
17 Thermocouple
18 Thermocouple display unit
19 Weighting unit
20 Weighting display unit
21 Growth atmosphere
22, 22.1 Openings/evacuation passages of the lid 12
23 $In_2O_3$ starting material
23.1 Top portion of the $In_2O_3$ starting material 23
23.2 Bottom portion of the $In_2O_3$ starting material 23
24 Crucible wall
26 Neck portion of the $In_2O_3$ starting material 23
27 Gaseous decomposition products of the $In_2O_3$ starting material 23
28.1 Top single crystal
28.2 Bottom single crystal
29 Neck crystal
30 Free space between top and bottom single crystals 28.1 and 28.2
103 Thermal system
104 Noble metal crucible of the thermal system 103
106 RF induction coil
106.1, 106.2 Layers of coil turns
106.3, 106.4 Separate induction coils
109 Crucible thermal insulation of the thermal system 103
109.1 Outer alumina tubes of the crucible thermal insulation 109
109.2 Zirconia granules of the crucible thermal insulation 109
110 Cover of the thermal system 103
111, 111.1 Evacuation passages/openings of the lid 112
111.3 Side openings between the lid 112 and the top edge of crucible 104
111.4 Horizontal evacuation channels of the top thermal insulation 113
111.5, 111.6 Vertical evacuation channels of the top thermal insulation 113
112 Lid of the cover 110
113 Top thermal insulation of the cover 110
124 Crucible wall
124.1 Cylindrical crucible wall
124.2 Barrel-shaped crucible wall
124.3 Cylindrical and partly barrel-shaped crucible wall
124.4 Trapezoidal crucible wall
125 Crucible bottom
125.1 Flat crucible bottom
125.2 Spherical crucible bottom
125.3 Conical crucible bottom
131 Afterheater of the thermal system 103
A, B, C, D, E Regions of a temperature profile

The invention claimed is:

1. A method for growing bulk $In_2O_3$ single crystals, comprising the steps of:
   i) providing into a growth chamber a thermal system comprising a noble metal crucible containing an initially non-conducting $In_2O_3$ starting material, a crucible thermal insulation surrounding the noble metal crucible at a bottom and a side, and an induction coil disposed around the noble metal crucible and coupled to a radio frequency generator, wherein a crucible wall thickness (th) is not greater than a penetration depth of an eddy current induced in the noble metal crucible wall by the induction coil:

$$th \leq \delta = \sqrt{1/(\pi f \mu \sigma)}$$

where $\delta$ is the penetration depth (or a skin depth), f is a generator frequency, $\mu$ is a permeability, and $\sigma$ is an electrical conductivity of the noble metal crucible, the generator frequency being in a range between 1 kHz and 2 MHz;
   ii) closing the noble metal crucible with a cover of the thermal system comprising at least a lid and having at least one evacuation passage for removing gaseous decomposition products of $In_2O_3$ from an interior of the noble metal crucible and keeping the interior of the noble metal crucible in communication with a growth atmosphere, wherein a cross-section area of the at least one evacuation passage is 30% or less of a cross-section area of the crucible;
   iii) introducing at least into the thermal system the growth atmosphere, which provides oxygen partial pressure between 0.005 bar and 0.2 bar around a melting point of $In_2O_3$;
   iv) heating the $In_2O_3$ starting material by conduction and radiation from the noble metal crucible which in turn is inductively heated by the induction coil;
   v) keeping at least inside the thermal system an oxygen partial pressure which is insufficient to avoid $In_2O_3$ decomposition, thus decomposing in a controlled way the $In_2O_3$ starting material during heating of the noble metal crucible, thereby increasing electrical conductivity of the $In_2O_3$ starting material with rising temperature;

vi) inducing, through the wall of the noble metal crucible, an eddy current in the $In_2O_3$ starting material, which becomes conducting around its melting point;
vii) melting the $In_2O_3$ starting material to form a melt comprising liquid $In_2O_3$ starting material by a combination of conductive, radiative, and electrical heating, the electrical heating being caused by the eddy current induced directly in the $In_2O_3$ starting material;
viii) electromagnetically levitating at least a portion of the liquid $In_2O_3$ starting material and forming at the same time a neck portion of the liquid $In_2O_3$ extending from the levitating top portion of the melt towards a bottom portion of the liquid $In_2O_3$ starting material at the crucible bottom, or towards the crucible bottom if all the liquid $In_2O_3$ starting material is levitating;
ix) monitoring and detecting the melting point of the $In_2O_3$ starting material by at least one melting detection means;
x) cooling the noble metal crucible containing the liquid $In_2O_3$ starting material to room temperature; and,
xi) solidifying during cooling down the liquid $In_2O_3$ starting material and forming at the same time at least one bulk $In_2O_3$ single crystal from the levitating and non-levitating portions of the liquid $In_2O_3$ starting material, which solidifies on top and bottom sides of the liquid neck portion acting as a seed, or on a top side of the liquid neck portion if all liquid $In_2O_3$ starting material is levitating.

2. The method according to claim 1, further comprising, between step vii) melting and step x) cooling, the step of:
xii) holding the $In_2O_3$ starting material in a liquid phase for a predetermined time, to allow $In_2O_3$ to decompose and thus increase its electrical conductivity.

3. The method according to claim 2, further comprising the step of:
xiii) overheating the $In_2O_3$ starting material in the liquid phase by a maximum of 5% in relation to a detected melting point, to allow $In_2O_3$ to decompose and thus increase its electrical conductivity.

4. The method according to claim 1, wherein the growth atmosphere provides oxygen, which changes in partial pressure from about 0 bar to about 0.1 bar with rising temperature from room temperature to a temperature in the range of 1950° C. to 2100° C.

5. The method according to claim 1, wherein a cooling rate of the noble metal crucible from the $In_2O_3$ liquid phase to the solidification point of the $In_2O_3$ liquid phase is between 50 K/h and 2000 K/h.

6. The method according to claim 1, wherein the at least one evacuation passage is in the form of at least one evacuation opening, wherein a cross-section area of the at least one evacuation opening is between 0.25% and 30% of the crucible cross-section area.

7. The method according to claim 6, wherein the cross-section area of the at least one evacuation opening is between 0.25% and 10% of the crucible cross-section area.

8. The method according to claim 1, wherein the induction coil is cylindrical, and the noble metal crucible is disposed within the induction coil in such a way that at least part of the liquid $In_2O_3$ starting material is located above a middle plane of the induction coil.

9. The method according to claim 1, wherein the crucible wall thickness (th) is between 0.5 and 3 mm, and the RF generator frequency is between 5 kHz and 100 kHz.

10. The method according to claim 1, wherein the melting detection means comprises at least one selected from the group consisting of: a pyrometer, a thermocouple, both the pyrometer and the thermocouple being adapted to detect a temperature of any part of the thermal system, a weighing unit adapted to detect mass losses of the $In_2O_3$ starting material, and a mass spectrometer to detect decomposition products of the $In_2O_3$ starting material.

11. An apparatus for growing bulk $In_2O_3$ single crystals from a melt, comprising:
a growth chamber;
a radio frequency (RF) generator;
an induction coil coupled to the RF generator and disposed inside the growth chamber;
a thermal system disposed within the induction coil in the growth chamber and being in communication with a growth atmosphere, which growth atmosphere provides oxygen partial pressure between 0.005 bar and 0.2 bar around a melting point of $In_2O_3$, the thermal system comprising:
i) a noble metal crucible for containing an initially non-conducting $In_2O_3$ starting material and subsequently grown crystals, the noble metal crucible being disposed within the induction coil and having a wall thickness (th), which wall thickness is not greater than a penetration depth of an eddy current induced in the noble metal crucible wall by the induction coil:

$$th \leq \delta = \sqrt{1/(\pi f \mu \sigma)}$$

where $\delta$ is the penetration depth (or a skin depth), f is a generator frequency, p is a permeability, and $\sigma$ is an electrical conductivity of the noble metal crucible, the generator frequency being in a range between 1 kHz and 2 MHz, wherein crucible and coil shapes are adapted to electromagnetically levitate a portion of the liquid $In_2O_3$ starting material and to form a neck portion of the liquid $In_2O_3$ extending from a levitating top portion of the melt toward a bottom portion of the liquid $In_2O_3$ starting material at the crucible bottom or toward a crucible bottom if all the liquid $In_2O_3$ starting material is levitating;
ii) crucible thermal insulation surrounding a bottom and a side wall of the noble metal crucible;
iii) a cover enclosing the noble metal crucible from a top of the crucible, the cover comprising at least a lid and having at least one evacuation passage adapted for removing gaseous decomposition products of $In_2O_3$ from an interior of the noble metal crucible and keeping the interior of the noble metal crucible in communication with said growth atmosphere, a cross section area of the at least one evacuation passage not exceeding 30% of a crucible cross section area; and
at least one melting detection means adapted to detect melting of the $In_2O_3$ starting material, and
iv) means for maintaining, at least inside the thermal system, an oxygen partial pressure between 0.005 bar and 0.2 bar around a melting point of $In_2O_3$ which is insufficient to avoid $In_2O_3$ decomposition, thus decomposing in a controlled way the $In_2O_3$ starting material during heating of the noble metal crucible, thereby increasing electrical conductivity of the $In_2O_3$ starting material with rising temperature.

12. The apparatus according to claim 11, wherein the cover of the thermal system comprises a lid having at least one evacuation passage in the form of at least one evacuation opening for removing gaseous decomposition products of $In_2O_3$ from the noble metal crucible, wherein the cross-section area of the at least one evacuation opening is between 0.25% and 30% of the crucible cross-section area.

13. The apparatus according to claim 12, wherein the cross-section area of the at least one evacuation opening of the lid is between 0.25% and 10% of the crucible cross-section area.

14. The apparatus according to claim 11, wherein a shape of the lid is selected from the group consisting of: planar, concave, or convex toward the interior of the noble metal crucible.

15. The apparatus according to claim 11, wherein the at least one evacuation passage of the cover is formed by at least one opening in the lid.

16. The apparatus according to claim 11, wherein the at least one evacuation passage of the cover is formed by at least one opening between the lid and a top edge of the noble metal crucible.

17. The apparatus according to claim 11, wherein the cover further comprises a top thermal insulation disposed on the lid, the top thermal insulation having at least one evacuation passage in the form of the evacuation channel in communication with at least one evacuation opening in the lid.

18. The apparatus according to claim 17, wherein the cover further comprises a noble metal afterheater supported by the lid and surrounded by the top thermal insulation.

19. The apparatus according to claim 11, wherein the crucible wall thickness (th) is between 0.5 mm and 3 mm, and the RF generator frequency is between 5 kHz and 100 kHz.

20. The apparatus according to claim 11, wherein the induction coil is cylindrical, and the noble metal crucible is disposed inside the induction coil in such a way, that at least part of the $In_2O_3$ starting material is located above a middle plane of the induction coil.

21. The apparatus according to claim 11, wherein the induction coil is conical in a bottom part thereof.

22. The apparatus according to claim 11, wherein the induction coil has in a bottom part thereof at least one extra turn.

23. The apparatus according to claim 11, wherein a shape of the noble metal crucible is selected from the group consisting of: cylindrical, at least partly conical, rounded at a bottom, barrel, and trapezoidal.

24. The apparatus according to claim 11, wherein the melting detection means comprises at least one selected from the group consisting of: a pyrometer, a thermocouple, both the pyrometer and the thermocouple being adapted to detect a temperature of any part of the thermal system, a weighing unit adapted to detect mass losses of the $In_2O_3$ starting material, and a mass spectrometer to detect decomposition products of the $In_2O_3$ starting material.

25. An undoped bulk $In_2O_3$ single crystal obtained from the melt according to the method of claim 1, the bulk $In_2O_3$ single crystal having a substantially similar size larger than about 2 mm in each of three dimensions, an electrical resistivity between 0.01 $\Omega$cm and 0.03 $\Omega$cm, and a free electron concentration in the range of $1\times10^{18}$ $cm^{-3}$ to $5\times10^{18}$ $cm^{-3}$, as measured by Hall effect.

26. The method according to claim 1, further comprising the step of:
    xiv) adding to the $In_2O_3$ starting material prior to heating one or more ferromagnetic elements selected from the group consisting of Fe, Co, Ni, Mn, and Cr at concentration between $10^{-8}$ mol % and 10 mol %.

27. The method according to claim 1, further comprising the step of:
    xv) subjecting the bulk $In_2O_3$ single crystal to a first heat treatment in a non-reducing atmosphere at temperature between 400° C. and 1400° C. for a time between 0.25 h and 300 h, to induce in the bulk $In_2O_3$ single crystal an electrical resistivity between 0.02 $\Omega$cm and 5 $\Omega$cm, and a free electron concentration between $0.2\times10^{17}$ $cm^{-3}$ and $20\times10^{17}$ $cm^{-3}$, as measured by Hall effect.

28. The method according to claim 27, further comprising the step of:
    xvi) subjecting the bulk $In_2O_3$ single crystal to a second heat treatment in a hydrogen-containing atmosphere at temperature between 200° C. and 1200° C. for time between 0.25 h and 100 h, to induce in the bulk $In_2O_3$ single crystal an electrical resistivity between 0.005 $\Omega$cm and 0.03 $\Omega$cm, and a free electron concentration between $10^{18}$ and $10^{19}$ $cm^{-3}$, as measured by Hall effect.

29. A substrate for homoepitaxy and heteroepitaxy comprising a melt-grown bulk $In_2O_3$ single crystal according to claim 25.

30. The substrate according to claim 29, wherein the heteroepitaxy includes GaN, AlN, InN, InGaN, AlGaN, and AlInN deposited on the substrate.

31. The method according to claim 4, wherein the growth atmosphere provides oxygen, which changes in partial pressure from about 0 bar to about 0.04 bar with rising temperature from room temperature to a temperature in the range 1950° C. to 2100° C.

32. An undoped bulk $In_2O_3$ single crystal obtained from the melt according to the method of claim 1, the bulk $In_2O_3$ single crystal having a substantially similar size of greater than several mm in each of three dimensions, an electrical resistivity between 0.01 $\Omega$cm and 0.03 $\Omega$cm, and a free electron concentration in the range of $1\times10^{18}$ $cm^{-3}$ to $5\times10^{18}$ $cm^{-3}$, as measured by Hall effect.

33. An undoped bulk $In_2O_3$ single crystal obtained from the melt according to the method of claim 1, the bulk $In_2O_3$ single crystal having a substantially similar size of greater than 3 mm in each of three dimensions, an electrical resistivity between 0.01 $\Omega$cm and 0.03 $\Omega$cm, and a free electron concentration in the range of $1\times10^{18}$ $cm^{-3}$ to $5\times10^{18}$ $cm^{-3}$, as measured by Hall effect.

* * * * *